(12) United States Patent
Mehandru et al.

(10) Patent No.: US 11,152,461 B2
(45) Date of Patent: Oct. 19, 2021

(54) SEMICONDUCTOR LAYER BETWEEN SOURCE/DRAIN REGIONS AND GATE SPACERS

(71) Applicant: INTEL CORPORATION, Santa Clara, CA (US)

(72) Inventors: Rishabh Mehandru, Portland, OR (US); Anupama Bowonder, Portland, OR (US); Biswajeet Guha, Hillsboro, OR (US); Tahir Ghani, Portland, OR (US); Stephen M. Cea, Hillsboro, OR (US); William Hsu, Hillsboro, OR (US); Szuya S Liao, Portland, OR (US); Pratik A. Patel, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 641 days.

(21) Appl. No.: 15/983,540

(22) Filed: May 18, 2018

(65) Prior Publication Data

US 2019/0355811 A1  Nov. 21, 2019

(51) Int. Cl.
*H01L 29/06* (2006.01)
*H01L 29/78* (2006.01)
*H01L 29/66* (2006.01)

(52) U.S. Cl.
CPC ...... *H01L 29/0646* (2013.01); *H01L 29/0615* (2013.01); *H01L 29/66795* (2013.01); *H01L 29/7851* (2013.01)

(58) Field of Classification Search
CPC ............. H01L 29/0646; H01L 29/7851; H01L 29/66795; H01L 29/0615; H01L 29/66469; H01L 29/0653; H01L 29/775; H01L 29/0847; H01L 29/0673; H01L 29/78696; H01L 29/42392; H01L 29/78618; H01L 29/66439; H01L 21/823821; B82Y 10/00

See application file for complete search history.

(56) References Cited

U.S. PATENT DOCUMENTS

| | | | |
|---|---|---|---|
| 2015/0263128 A1* | 9/2015 | Basker | H01L 29/0847 257/288 |
| 2018/0175201 A1* | 6/2018 | Wang | H01L 29/7851 |
| 2019/0341300 A1* | 11/2019 | Glass | H01L 21/76831 |
| 2019/0348415 A1* | 11/2019 | Sung | H01L 29/0847 |
| 2020/0075727 A1* | 3/2020 | Basu | H01L 29/785 |
| 2020/0266296 A1* | 8/2020 | Chu-Kung | H01L 29/66636 |
| 2021/0036143 A1* | 2/2021 | Liao | H01L 29/66545 |
| 2021/0066454 A1* | 3/2021 | Maeda | B82Y 10/00 |
| 2021/0119037 A1* | 4/2021 | Li | H01L 21/823431 |

* cited by examiner

*Primary Examiner* — Victor A Mandala
(74) *Attorney, Agent, or Firm* — Schwabe, Williamson & Wyatt, P.C.

(57) ABSTRACT

A semiconductor device is described that includes a first semiconductor layer conformally disposed on at least a portion of a source region and a second semiconductor layer conformally disposed on at least a portion of a drain region between the source/drain regions and corresponding gate spacers. The semiconductor layer can prevent diffusion and/or segregation of dopants from the source and drain regions into the gate spacers of the gate stack. Maintaining the intended location of dopant atoms in the source region and drain region improves the electrical characteristics of the semiconductor device including the external resistance ("$R_{ext}$") of the semiconductor device.

20 Claims, 13 Drawing Sheets

SEMICONDUCTOR LAYER BETWEEN SOURCE/DRAIN REGIONS AND GATE SPACERS

BACKGROUND

Semiconductor devices are electronic components that exploit the electronic properties of semiconductor materials, such as silicon (Si), germanium (Ge), and silicon germanium (SiGe). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. In instances where the charge carriers are electrons, the FET is referred to as an n-channel device, and in instances where the charge carriers are holes, the FET is referred to as a p-channel device. Standard dopant used for Si, Ge, and SiGe includes boron (B) for p-type (acceptor) dopant and phosphorous (P) or arsenic (As) for n-type (donor) dopant. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin).

Figure 1A:
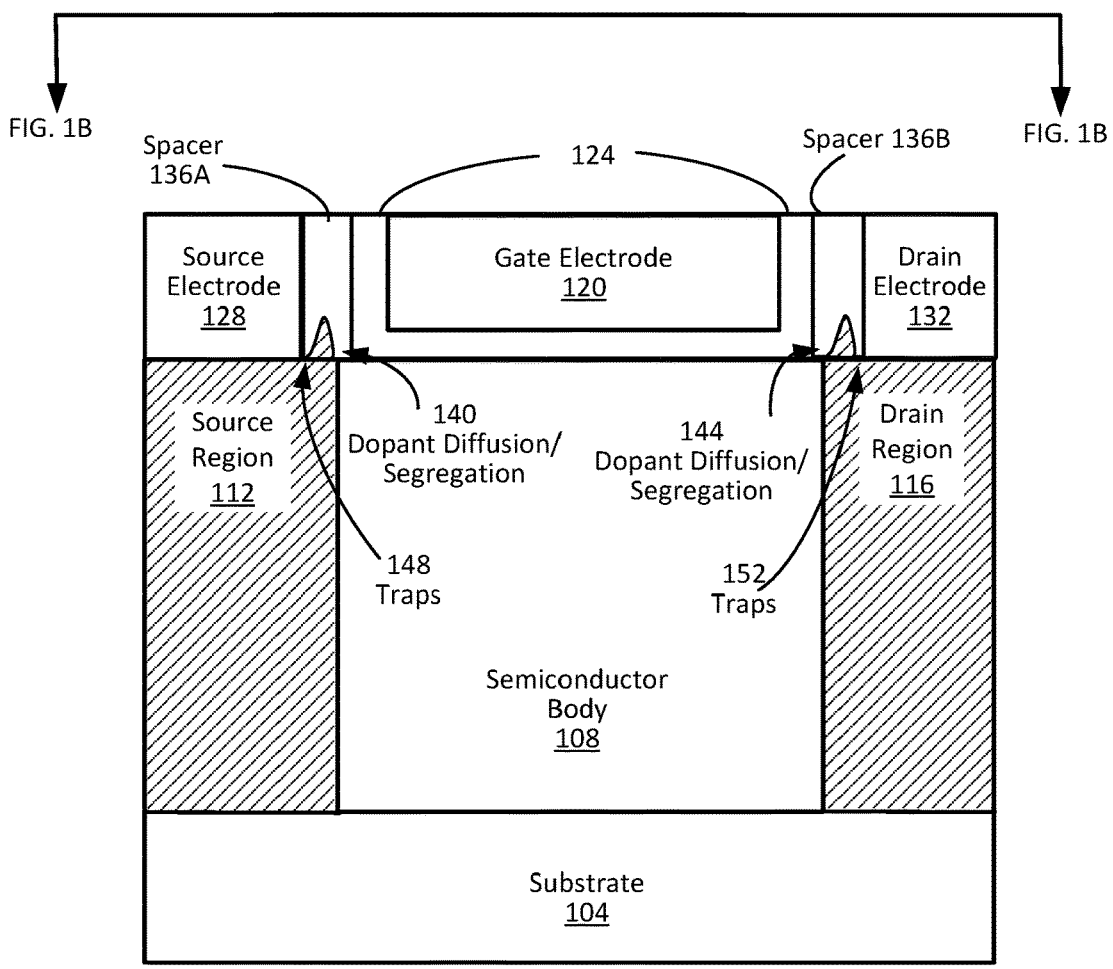
FIG. 1A is an example cross-sectional view (taken perpendicular to a gate of a FinFET transistor) illustrating dopant diffusion from a source region and a drain region into corresponding gate spacers, and illustration the location of charge traps.

The figures depict various embodiments of the present disclosure for purposes of illustration only. Numerous variations, configurations, and other embodiments will be apparent from the following detailed discussion. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Example embodiments described herein include a FinFET semiconductor device that includes a first semiconductor layer conformally disposed on at least a portion of a source region and a second semiconductor layer conformally disposed on at least a portion of a drain region. Furthermore, the semiconductor layer is disposed between the source/drain regions and corresponding gate spacers on opposing sides of a gate structure. Thus disposed, the semiconductor layer provides a number of advantages to FinFET semiconductor devices. In one example, the semiconductor layer can prevent diffusion and/or segregation of dopants from the source and drain regions into the gate stack, and more specifically, into the gate spacers of the gate stack. Maintaining the intended location of dopant atoms in the source region and drain region at locations proximate to the interface with a semiconductor body improves the electrical characteristics of the semiconductor device. Improved characteristics include, but are not limited to, decreased external resistance ("$R_{ext}$") of the semiconductor device. Reducing $R_{ext}$ increases the energy efficiency and response time (e.g., a time to process one bit of information) of the semiconductor device. In another example of an advantage, the semiconductor layer can prevent the formation of interface "traps" that can reduce charge carrier mobility in the source and drain regions.

General Overview

One factor in the design of transistors, whether a planar architecture or a non-planar architecture, is the mobility of charge carriers within source and drain regions. Improving charge carrier mobility is accomplished in some examples by adding a dopant material to native or replacement source region and/or drain region materials. The dopant material can contribute charge carriers (whether holes or electrons) to the semiconducting material of the source region/drain regions, thus improving the electrical characteristics of these regions and the functioning of the transistor. In some examples, the dopant concentration is higher at locations of the source region and/or drain region proximate to a semiconductor body (between the source and drain regions) that includes the channel region. These regions, often referred to as "tips" can extend at least partially under the gate structure, and in particular under the gate spacers.

However, in one example, mechanisms can operate so as to reduce the benefits that come from high dopant concentration in a tip region. For example, dopant atoms within the source/drain tip regions can diffuse and/or segregate from the source/drain regions into gate spacers. In another example, "traps" such as dangling atomic bonds can inhibit charge carrier flow through the semiconductor device.

Figure 1B:
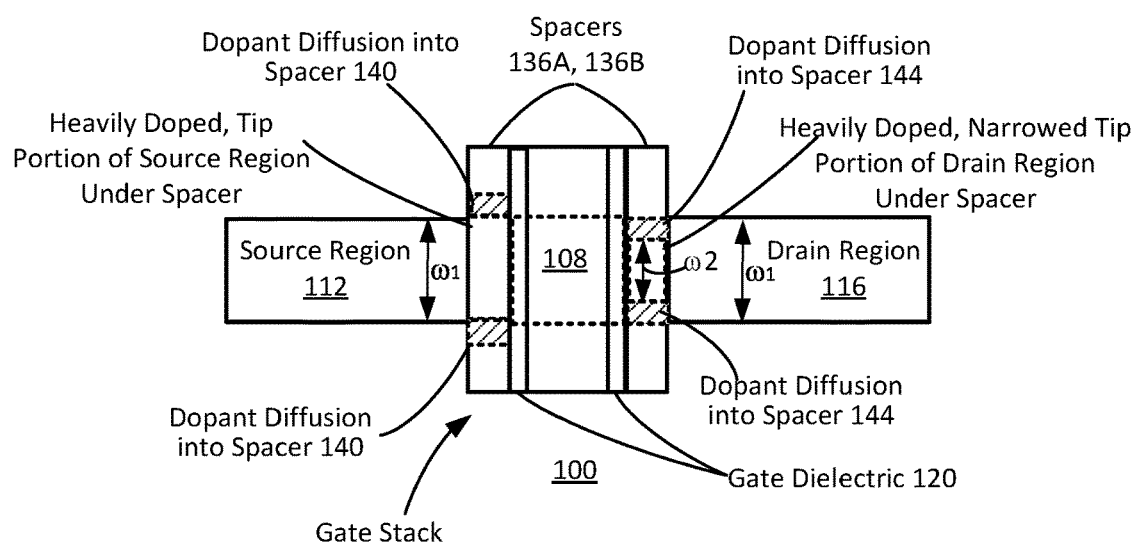
FIG. 1B is a plan view illustration of the example depicted in FIG. 1A showing dopant diffusion from the source region into a first corresponding gate spacer, diffusion from the drain region into a second corresponding gate spacer, and also showing a reduction in width of a drain region proximate to a semiconductor body.

These mechanisms are schematically illustrated in FIGS. 1A and 1B. FIG. 1A is a cross-sectional view of a semiconductor device 100 taken perpendicular to a gate stack. FIG. 1B is a plan view of the device 100 taken in the direction indicated in FIG. 1A.

The semiconductor device 100 depicted in FIGS. 1A and 1B includes a substrate 104, a semiconductor body 108, a source region 112 and a drain region 116. The semiconductor device 100 also includes a gate electrode 120, a gate dielectric layer 124, a source electrode 128, a drain electrode 132, and spacers 136A, 136B.

As can be seen in these figures, the source region 112 and the drain region 116 are disposed on (and/or over) the substrate 104. A source electrode 128 and a drain electrode 132 are disposed on (and/or over) the source region 112 and the drain region 116, respectively. The semiconductor body 108, which can include a channel region of the semiconductor device 100, is disposed between the source region 112 and the drain region 116 and on (and/or over) the substrate 104. A gate electrode 120 and gate dielectric layer 124 are disposed over the semiconductor body 108. As shown, the first gate spacer 136A is disposed between the source electrode 128 and the gate electrode 120, and more specifically between the source electrode 128 and a corresponding side of the gate dielectric layer 124. Similarly, the second gate spacer 136B is disposed between the drain electrode 132 and the gate electrode 120, and more specifically between the drain electrode 132 and a corresponding side of the gate dielectric layer 124.

The gate spacers 136A, 136B are at least partially disposed over the source region 112 and the drain region 116. As mentioned above, in some cases dopant atoms from the source region 112 and/or drain region 116 can diffuse and/or segregate into an overlapping portion of a corresponding spacer 136A, 136. This is shown in FIGS. 1A and 1B as patterned regions of dopant diffusion/segregation 140, 144.

Relocation of dopant atoms from the source/drain regions to the gate spacers by diffusion and/or segregation decreases the dopant concentration in the tip regions where a high dopant concentration may be desired. With the dopant atoms unavailable to contribute charge carriers to the S/D regions, the performance of the semiconductor device suffers. This is because charge carriers associated with dopant atoms are not available in the tip regions to increase current through the transistor and decrease the transistor capacitance.

In another example, various "traps" can form at an interface between one or both of the source region and the drain region and a corresponding gate spacer. These are illustrated in FIG. 1A as source region traps 148 and drain region traps 152. Examples of these traps include, but are not limited to, dangling atomic bonds as well as crystallographic defects. These traps can accumulate electrical charge as it moves through the transistor, thus reducing charge carrier mobility and the performance of the FinFET. Furthermore, as electrical charge accumulates within the traps, the likelihood of Coulombic scattering increases, further decreasing the performance of the FinFET.

FIG. 1B illustrates another example of a change to a source region and/or drain region that can detract from the operation and performance of a semiconductor device 100. As shown in FIG. 1B, a width ω1 of the source region 112 is uniform through portions of the source region 112, including the portion of the source region 112 disposed under the spacer 136A. However, this uniformity in dimension is not the case in this example for the drain region 116. While the portion of the drain region 116 not disposed under the spacer 136B has a width ω1, the portion of the drain region 116 that is disposed under the spacer 136B has a width ω2 that is less that the width ω1. This reduction in width can be caused by, for example, accelerated oxidation and/or etching for some compositions of source regions 112 and/or drain regions 116. For example, thermal processing of the semiconductor device 100 prior to deposition of the gate stack (which includes the spacers 136A, 136B) may lead to faster oxidation of source/drain regions composed of silicon and germanium compared to source/drain regions that lack germanium. Regardless of the cause, a narrowed source region and/or drain region proximate to the semiconductor body 108 and under the spacers 136A, 136B can increase external resistance (which is a function of source/drain cross-sectional area) of the semiconductor device 100, degrading performance. While FIG. 1B illustrates this narrowing for the drain region 116, it will be appreciated that one or both of the source region 112 and the drain region 116 can have a narrowed portion.

Thus, in accordance with some examples of the present disclosure, transistor devices are disclosed that include at least one of a first semiconductor layer disposed between a source region and a corresponding first gate spacer, and a second semiconductor layer disposed between a drain region and a corresponding second gate spacer. In some examples, the semiconductor layer is conformally disposed over one or both of the source region and the drain region. In some embodiments, FinFET semiconductor devices according to the present disclosure have reduced interfacial traps, reduced dopant diffusion into gate spacers, and accordingly better charge carrier mobility throughout the device. In some examples, a cross-sectional area of the source region and/or drain region under corresponding gate spacers is approximately equal to that of other portions of the source region and/or drain region not under the spacer. A continuous cross-sectional area of the source region and/or drain region, particularly proximate to a semiconductor body, can reduce external resistance ($R_{ext}$).

It is noted that designations such "above" or "below" or "top" or "bottom" or "top side" or "bottom side" are not intended to necessarily implicate a limitation as to orientation of the embodiments described herein. Rather, such terminology is simply used in a relative sense to consistently describe a structure as it exists in any one particular orientation and as illustrated herein.

Fabrication Techniques

Figure 2:
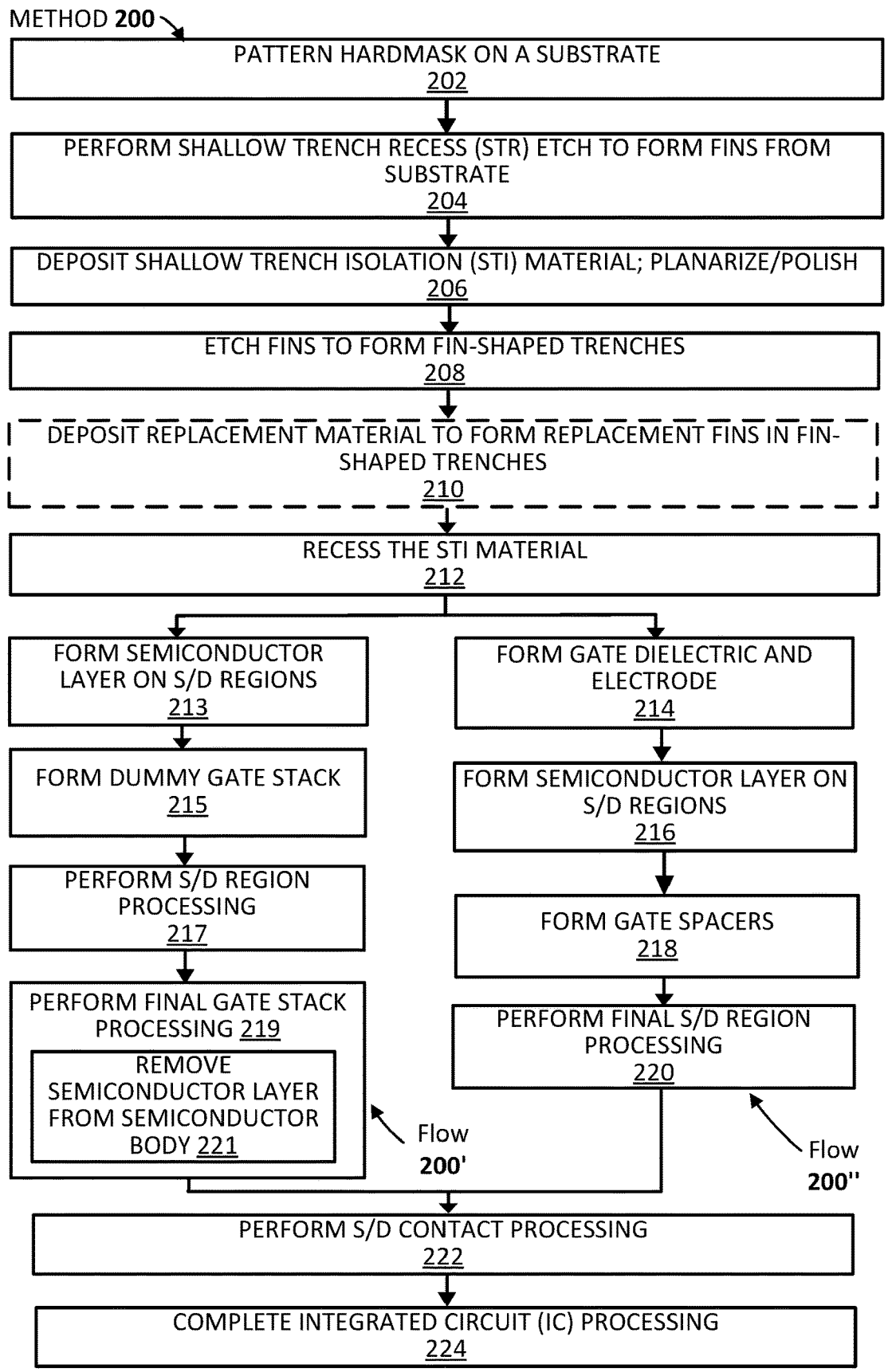
FIG. 2 is a method flow diagram of an example method for the fabrication of integrated circuit structures that include a semiconductor layer between a source region and a first gate spacer, and between the drain region and a second gate spacer, in accordance with some embodiments of the present disclosure.
Figure 3A:
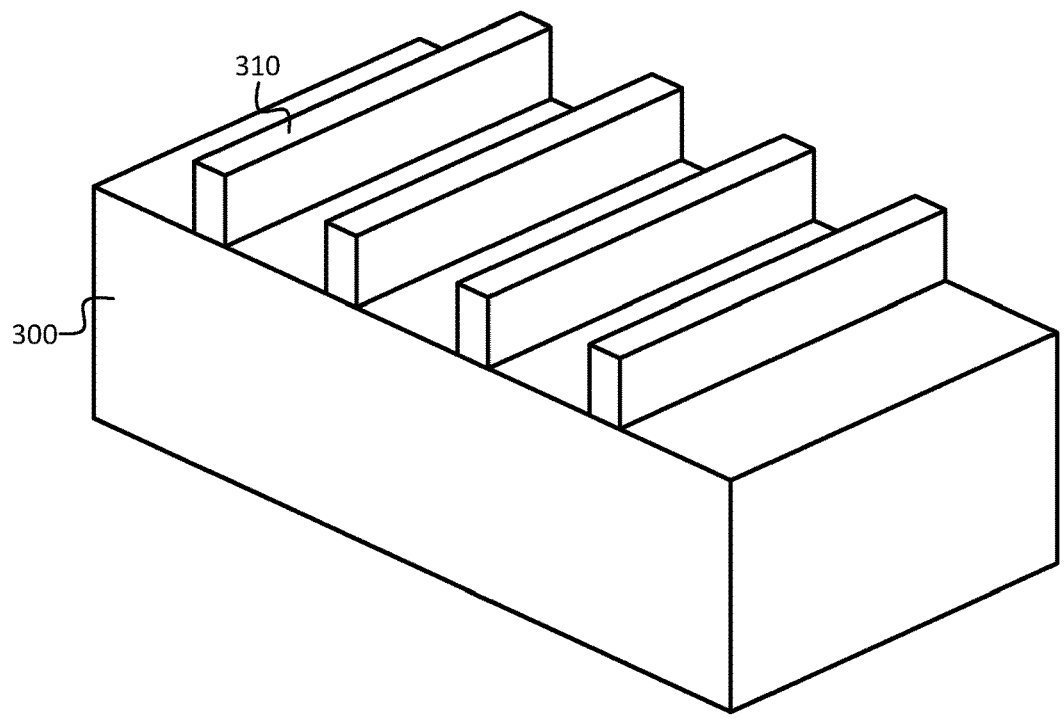
FIGS. 3A-3N illustrate example integrated circuit (IC) structures resulting from a method for forming a semiconductor layer between a source region and a first gate spacer and another semiconductor layer between a drain region and a second gate spacer, as illustrated in FIG. 2, in accordance with some embodiments of the present disclosure.

FIG. 2 depicts an example method 200 by which some embodiments of the present disclosure can be fabricated. Within the example method 200 are alternate flows 200' and 200", which illustrate alternative processes by which a semiconductor layer can be formed between a source/drain region and a corresponding gate spacer, as described above. FIGS. 3A-3N are perspective or cross-sectional views that illustrate physical structures corresponding to various aspects of the method 200. Concurrent reference to FIG. 2 and FIGS. 3A-3N will facilitate explanation. It will be appreciated that the FIGS. 3A-3N are drawn primarily to aid description and are not necessarily drawn to scale or to reflect the precise conformations of manufactured structures. For example, while various fins of FinFET devices are illustrated as having a rectangular cross-section, it will be appreciated that manufactured structures may be more rounded, and/or have shapes that reflect the underlying crystal structure of the material being used to form the fin.

Method 200 of FIG. 2 includes patterning 202 hardmask on a substrate, such as patterning hardmask 310 on substrate 300 to form the example structure of FIG. 3A, in accordance with some embodiments. In some embodiments, hardmask 310 may be deposited or otherwise formed on substrate 300 using any suitable techniques as will be apparent in light of this disclosure. For example, hardmask 310 may be blanket deposited or otherwise grown on substrate 300 using chemical vapor deposition (CVD), atomic layer deposition (ALD), physical vapor deposition (PVD), spin-on processing, and/or any other suitable process to form hardmask 310 on substrate 300. In some instances, the top surface of substrate 300 on which hardmask 310 is to be deposited may be treated (e.g., via chemical treatment, thermal treatment, etc.) prior to deposition of the hardmask 310 material. After being blanket formed on substrate 300, hardmask 310 may then be patterned using any suitable techniques, such as one or more lithography and etch processes, for example. Hardmask 310 may include any suitable material, such as oxide material, nitride material, and/or any other suitable dielectric/electrical insulator material, for example. Specific oxide and nitride materials may include silicon oxide, titanium oxide, hafnium oxide, aluminum oxide, silicon nitride, and titanium nitride, just to name a few examples. In some cases, the material of hardmask 310 may be selected based on the material of substrate 300, for example.

In some embodiments the substrate 300 may be: a bulk substrate including group IV semiconductor material (e.g., Si, Ge, SiGe), group III-V semiconductor material, and/or any other suitable material(s) as will be apparent in light of this disclosure; an X on insulator (XOI) structure where X is one of the aforementioned materials (e.g., group IV and/or group III-V semiconductor material) and the insulator material is an oxide material or dielectric material or some other electrically insulating material, such that the XOI structure includes the electrically insulating material layer between two semiconductor layers; or some other suitable multilayer structure where the top layer includes one of the aforementioned semiconductor materials (e.g., group IV and/or group III-V semiconductor material). The use of "group IV semiconductor material" (or "group IV material" or generally, "IV") herein includes at least one group IV element (e.g., silicon, germanium, carbon, tin), such as silicon (Si), germanium (Ge), silicon germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), and so forth. Note that group III may also be known as the boron group or IUPAC group 13, group IV may also be known as the carbon group or IUPAC group 14, and group V may also be known as the nitrogen family or IUPAC group 15, for example.

In some embodiments, substrate 300 may be doped with any suitable n-type and/or p-type dopant selected in light of the dopant used to dope replacement fins (as described herein). For instance, in the case, of a Si substrate, the Si may be p-type doped using a suitable acceptor (e.g., boron) or n-type doped using a suitable donor (e.g., phosphorous, arsenic), to provide some example cases. However, in some embodiments, substrate 300 may be undoped/intrinsic or relatively minimally doped (such as including a dopant concentration of less than 1E16 atoms per cubic cm), as long as a band offset in a sub-fin region is maintained with the source and drain regions, as described herein. In some embodiments, substrate 300 may include a surface crystalline orientation described by a Miller index of (100), (110), or (111), or its equivalents, as will be apparent in light of this disclosure. Although substrate 300, in this example embodiment, is shown as having a thickness (dimension in the Y-axis direction) similar to other layers shown in subsequent structures for ease of illustration, in some instances, substrate 300 may be much thicker than the other layers, such as having a thickness in the range of 50 to 950 microns, for example, or any other suitable thickness as will be apparent in light of this disclosure.

In some embodiments, substrate 300 may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various radio frequency (RF) devices, various sensors, or any other suitable semiconductor or IC devices, depending on the end use or target application. Accordingly, in some embodiments, the structures described herein may be included in a system-on-chip (SoC) application, as will be apparent in light of this disclosure.

Figure 3B:
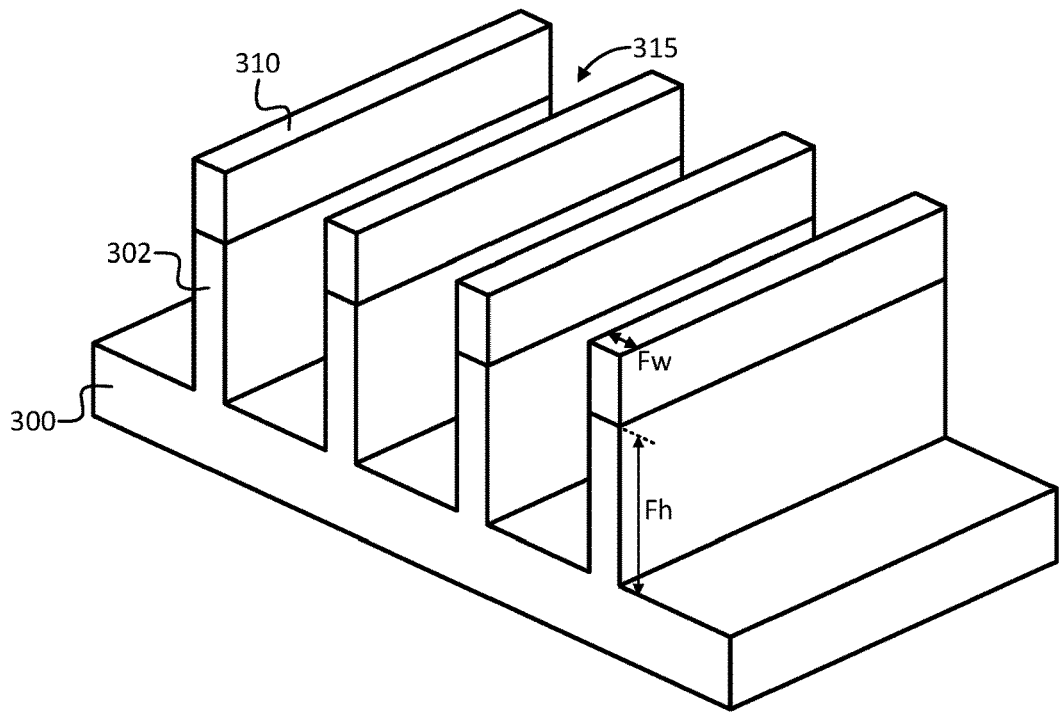

Method 200 of FIG. 2 continues with performing 204 shallow trench recess (STR) etch to form fins 302 from substrate 300, thereby forming the resulting example structure shown in FIG. 3B, in accordance with some embodiments. In some embodiments, the STR etch 204 used to form trenches 315 and fins 302 may include any suitable techniques, such as various masking processes and wet and/or dry etching processes, for example. In some cases, STR etch 204 may be performed in-situ/without air break, while in other cases, STR etch 204 may be performed ex-situ, for example. Trenches 315 may be formed with varying widths (dimension in the X-axis direction) and depths (dimension in the Y-axis direction) as can be understood based on this disclosure. For example, multiple hardmask patterning 202 and STR etching 204 processes may be performed to achieve varying depths in the trenches 315 between fins 302. Fins 302 may be formed to have varying widths Fw (dimension in the X-axis direction) and heights Fh (dimension in the Y-axis direction). Note that although hardmask structures 310 are still present in the example structure of FIG. 3B, in some cases, that need not be the case, as they may have been consumed during the STR etch, for example.

In some embodiments, the fin widths Fw (dimension in the horizontal or X-axis direction) may be in the range of 2-400 nm (or in a subrange of 2-10, 2-20, 2-50, 2-100, 2-200, 4-10, 4-20, 4-50, 4-100, 4-200, 4-400, 10-20, 10-50, 10-100, 10-200, 10-400, 50-100, 50-200, 50-400, or 100-400 nm), for example, or any other suitable value or range as will be apparent in light of this disclosure. In some embodiments, the fin heights Fh (dimension in the vertical or Y-axis direction) may be in the range of 4-800 nm (or in a subrange of 4-10, 4-20, 4-50, 4-100, 4-200, 4-400, 10-20, 10-50, 10-100, 10-200, 10-400, 10-800, 50-100, 50-200, 50-400, 50-800, 100-400, 100-800, or 400-800 nm), for example, or any other suitable value or range as will be apparent in light of this disclosure. In some embodiments, the fin heights Fh may be at least 25, 50, 75, 100, 125, 150, 175, 200, 300, 400, or 500, 600, 700, or 800 nm tall, or greater than any other suitable threshold height as will be apparent in light of this disclosure. In some embodiments, the height to width ratio of the fins (Fh:Fw) may be greater than 1, such as greater than 1.5, 2, 2.5, 3, 3.5, 4, 4.5, 5, 6, 7, 8, 9, or 10, or greater than any other suitable threshold ratio, as will be apparent in light of this disclosure. Note that the trenches 315 and fins 302 are each shown as having essentially the same sizes and shapes in this example structure for ease of illustration; however, the present disclosure is not intended to be so limited. For example, in some embodiments, the fins 302 may be formed to have varying heights Fh, varying widths Fw, varying starting points (or varying starting heights), varying shapes, and/or any other suitable variations as will be apparent in light of this disclosure. Moreover, trenches 315 may be formed to have varying depths, varying widths, varying starting points (or varying starting depths), varying shapes, and/or any other suitable variations as will be apparent in light of this disclosure. Further note that although four fins 302 are shown in the example structure of FIG. 3B for ease of illustration, any number of fins may be formed, such as one, two, three, five, ten, hundreds, thousands, millions, billions, and so forth, as can be understood based on this disclosure.

Figure 3C:
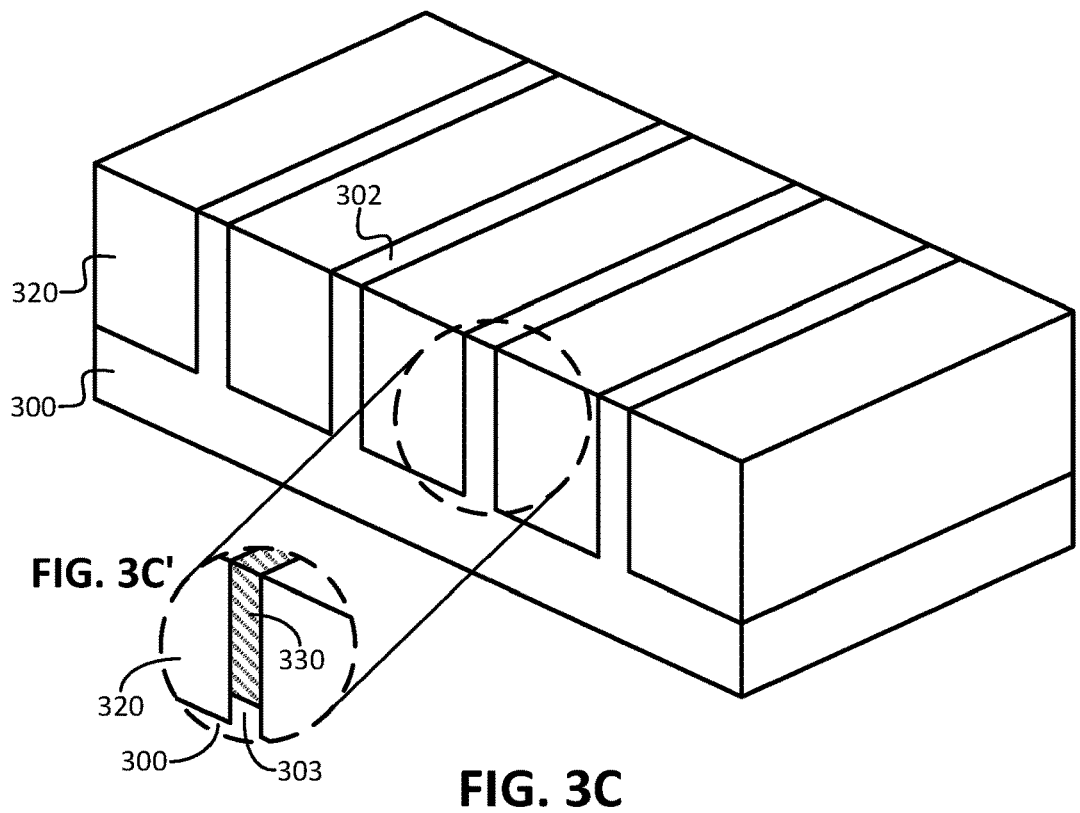

Method 200 of FIG. 1 continues with depositing 206 shallow trench isolation (STI) material 320 and planarizing/polishing the structure to form the example resulting structure of FIG. 3C, in accordance with some embodiments. In some embodiments, deposition 206 of STI material 320 may include any suitable deposition techniques, such as those described herein (e.g., CVD, ALD, PVD), or any other suitable deposition process. In some embodiments, STI material 320 (which may be referred to as an STI layer) may include any suitable electrically insulating material, such as one or more dielectric, oxide (e.g., silicon dioxide), and/or nitride (e.g., silicon nitride) materials. In some embodiments, the material of STI layer 320 may selected based on the material of substrate 300. For instance, in the case of a Si substrate, the STI material may be selected to be silicon dioxide or silicon nitride, to provide some examples. In some embodiments, the planarizing and/or polishing process(es) performed after forming STI material 320 may include any suitable techniques, such as chemical-mechanical planarization/polishing (CMP) processes, for example.

In embodiments where the fins are to be removed and replaced with replacement semiconductor material (e.g., to be used in the channel region of one or more transistor devices), the structure of FIG. 3C enables such processing. For example, continuing from the structure of FIG. 3C, fins 302 may be recessed or removed using selective etch processing (e.g., for a given etchant, the semiconductor material of fins 302 is removed selective to the insulator material of STI layer 320) to form 208 fin-shaped trenches between STI material 320 in which replacement semiconductor material can be deposited/grown 210 (e.g., using any suitable techniques, such as CVD, metal-organic CVD (MOCVD), ALD, molecular beam epitaxy (MBE), PVD). For instance, FIG. 3C' is a magnified view of a portion of FIG. 3C illustrating alternative recess and replace 210 processing to form a replacement material fin, in accordance with some embodiments. In FIG. 3C', replacement fin 330 was formed, and the replacement fin 330 (and generally, any replacement fin formed) may include any suitable semiconductor material (e.g., group IV and/or III-V semiconductor material). For instance, replacement fins including SiGe or Ge may be formed by removing native Si fins during such processing and replacing them with the SiGe or Ge material, to provide some examples. In addition, replacement fin 330 may include any suitable n-type or p-type dopant that is selected so that, ultimately, a source region and a drain region have an oppositely charged carrier to that of a substrate, as described herein. In some embodiments, replacement material fins, such as replacement fin 330 of FIG. 3C' may be formed using alternative processing. For instance, in some embodiments, replacement material fins may be formed by blanket-growing 210 the replacement material on the substrate (e.g., using epitaxial deposition processing) and then patterning the replacement material into replacement material fins, to provide an example alternative. Such an example alternative process may also include forming STI material between the replacement material fins to form a structure similar to that shown in FIG. 3C', for instance. Note that replacement fin 330 is illustrated with patterning/shading to merely assist with visually identifying that feature.

Note that only one fin is shown being replaced in the example embodiment of FIG. 3C'; however, the present disclosure is not intended to be so limited. In some embodiments, all of the native fins 302 may be replaced 210 or only a subset may be replaced (e.g., such that some replacement fins are available for subsequent processing and some native fins 302 remain for subsequent processing). Further, in some embodiments, the recess and replace process may be performed as many times as desired to form as many subsets of replacement fins as desired by masking off the areas not to be processes for each replacement fin subset processing. In some such embodiments, a first subset of replacement fins may be formed for n-channel transistors (e.g., where the first replacement material is selected to increase electron mobility) and a second subset of replacement fins may be formed for p-channel transistors (e.g., where the second replacement material is selected to increase hole mobility). Further still, in some embodiments, a multilayer replacement fin may be formed to enable the subsequent formation of nanowires or nanoribbons in the channel region of one or more transistors, where some of the layers in the multilayer replacement fin are sacrificial and intended to be removed via selective etching (e.g., during replacement gate processing.

Note that the recess process used to form 210 replacement fin 330 included recessing native fin 302 (i.e., native to substrate 300) to a depth as shown, such that a portion of that native fin 302 remains (indicated in FIG. 3C' as fin portion 303.

Continuing with the scenario depicted in FIG. 3C', generally, in a trench fill integration scheme, the fins may be formed to have particular height to width ratios (e.g., at least 2-5) such that when they are later removed or recessed, the resulting trenches formed allow the replacement material deposited to grow vertically from the native substrate bottom and be confined by non-crystalline/dielectric sidewalls. The material used to fill these trenches may be sufficiently lattice matched to the substrate (or to a buffer layer used between the substrate and replacement material) such that effectively no relaxation or threading misfit dislocation formation occurs (e.g., the misfit dislocations occur at levels below 1E5 dislocations per square cm). For instance, this lattice match condition is true for native Si fins and trench fill of SiGe replacement material having Ge concentration (by atomic percentage) of less than 45% and fin heights Fh of less than 50 nm, to provide an example. Alternatively, using the Si substrate example (where the native Si fins are recessed to form trenches), a replacement material trench fill of Ge, SiGe with Ge concentration of at least 80%, or GaAs can be performed such that the dislocations form right at the native/replacement material interface and again effectively no threading misfit dislocation formation occurs at the top surface of the replacement material fin (e.g., the misfit dislocations occur at levels below 1E5 dislocations per square cm). In some embodiments, replacement fins (such as replacement fin 330) may be formed to include Ge-rich material, such that a portion of one or more of those replacement fins can be used in the channel region of one or more transistors, as can be understood based on this disclosure. Alternative embodiments can includes forming an epitaxial growth layer on the native substrate from which the replacement fin is regrown.

Figure 3D:
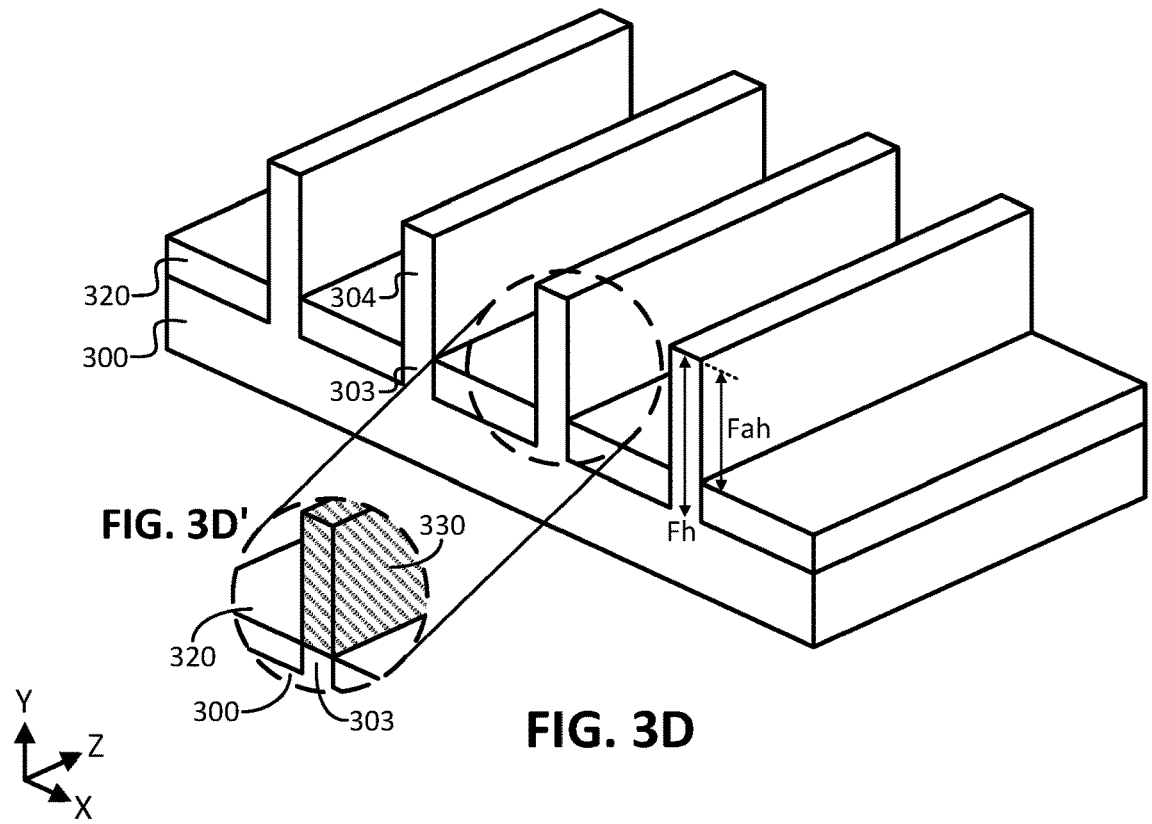
Figure 3E:
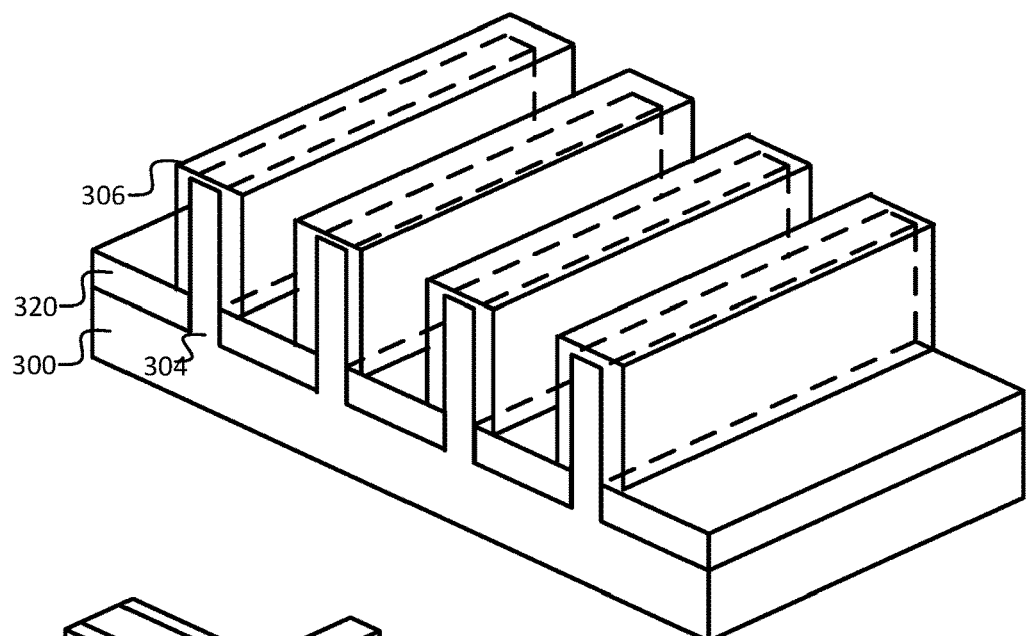

Method 200 of FIG. 2 continues with recessing 212 the STI material 320 to cause at least a portion 304 of fins 302 to protrude from the STI plane, thereby forming the resulting example structure shown in FIG. 3D, in accordance with some embodiments. In some embodiments, recessing 212 may be performed using any suitable techniques, such as using one or more wet and/or dry etch processes that allow the STI material 320 to be selectively recessed relative to the material of fin 302, and/or any other suitable processing as will be apparent in light of this disclosure. As can be understood based on this disclosure, fin portions 304 may be used in the active channel region of one or more transistors, such that fin portions 304 (the portions of fins 302 above the top plane of STI layer 320 after recess 212 has been performed) may be referred to as active fin portions herein, for example.

As shown in FIG. 3D, the portions 304 of fins 302 protruding above the top plane of STI layer 320 have an active fin height indicated as Fah, which may be in the range of 4-800 nm (e.g., in the subrange of 4-10, 4-20, 4-50, 4-100, 4-200, 4-400, 10-20, 10-50, 10-100, 10-200, 10-400, 10-800, 50-100, 50-200, 50-400, 50-800, 100-400, 100-800, or 400-800 nm), for example, or any other suitable value or range, as will be apparent in light of this disclosure. In some embodiments, the active fin heights Fah may be at least 25, 50, 75, 100, 125, 150, 175, 200, 300, 400, 500, 600, 700, or 800 nm tall, or greater than any other suitable threshold height as will be apparent in light of this disclosure. The active fin height is referred to as such because at least one portion of that fin (along the Z-axis) may be used in the channel region of a least one transistor, where the fin portion 303 (which is between two regions of STI material 320) is desired to not be a part of the channel region that includes the location for the active channel. FIG. 3D' is a magnified view of a portion of FIG. 3D illustrating the replacement fin 330 from FIG. 3C' after the STI material has been recessed, in accordance with some embodiments. Although replacement fin 330 was formed using the techniques described herein that employ a fin-shaped trench, in other embodiments, replacement fin 330 may be formed using alternative techniques, such as by blanket depositing the replacement material and forming the replacement material into fins, followed by STI processing, as previously described. Also note that in embodiments employing planar transistor configurations, recess process 208 need not be performed, as the transistor may be formed using the top portion of fin 302 from FIG. 3C (or the top portion of fin 330 from FIG. 3C'), for example.

Method 200 of FIG. 2 can continue in either one of two flows 200' or 200" to form a semiconductor layer between source/drain regions and a corresponding gate spacer. The description for flow 200' is described first, followed by the description for flow 200", each of which corresponds to cross-sectional or perspective views in FIGS. 3E-3J and FIGS. 3K-3M, respectively.

The method 200 that is performed with the flow 200' includes forming the semiconductor layer 306 on the fins 304. In some examples, such as the one shown in FIG. 3E, the semiconductor layer 306 is conformal to the individual fins 304, extending from a top surface of each fin 304, down opposing sidewalls of each fin 304 to the exposed surface of the STI layer 320 (in other words, extending down to an interface between a fin 304 and the STI layer 320).

The semiconductor layer 306 is generally a semiconductor material that is distinct from the semiconductor material of the fin 304, and ultimately distinct from the semiconductor materials forming the source/drain regions and the semiconductor body. In one example, the fin 304 can be fabricated from silicon and germanium and the semiconductor layer 306 can be fabricated from silicon. In one example, the fin 304 can be fabricated from indium, gallium, and arsenic, and the semiconductor layer 306 can be fabricated from indium and phosphorous. In one example, the fin 304 can be fabricated from indium, gallium, and arsenic, and the semiconductor layer 306 can be fabricated from indium, gallium, aluminum, and nitrogen. In one example, the fin 304 can be fabricated from gallium and arsenic and the semiconductor layer 306 can be fabricated from indium and phosphorous. In one example, the fin 304 can be fabricated from gallium and arsenic and the semiconductor layer 306 can be fabricated from indium, gallium, aluminum, and nitrogen.

The semiconductor layer 306 can be formed 213 using any of the techniques described above that can form an epitaxial interface with the underlying fin 304. That is, formed 213 so that there is a one to one correspondence between crystallographic planes of the single crystal first semiconductor layer 306 and the single crystal fin 304). These techniques include, but are not limited to, such as CVD, PECVD, MOCVD, molecular beam epitaxy, and ALD. In some examples, a thickness of the semiconductor layer 306 (i.e., a dimension of the layer 306 measured from the interface with the fin 304 and the exposed surface of the layer 306 shown in FIG. 3E can be within any of the following range: 0.2 nm to 4 nm; from 0.2 nm to 3 nm; from 0.2 nm to 1.5 nm; from 1 nm to 4 nm; from 1 nm to 3 nm; from 2 nm to 4 nm; from 2 nm to 3.5 nm.

Figure 3F:
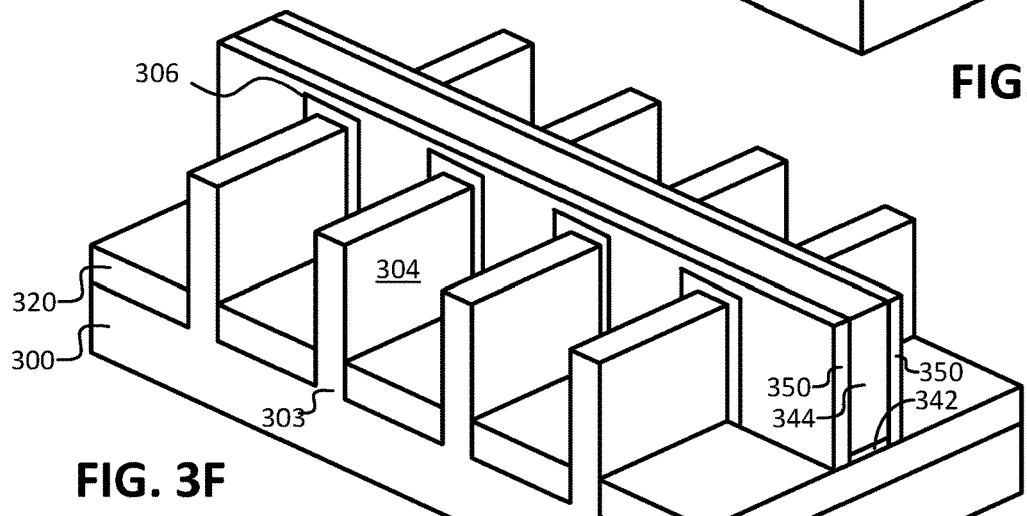
Figure 3G:
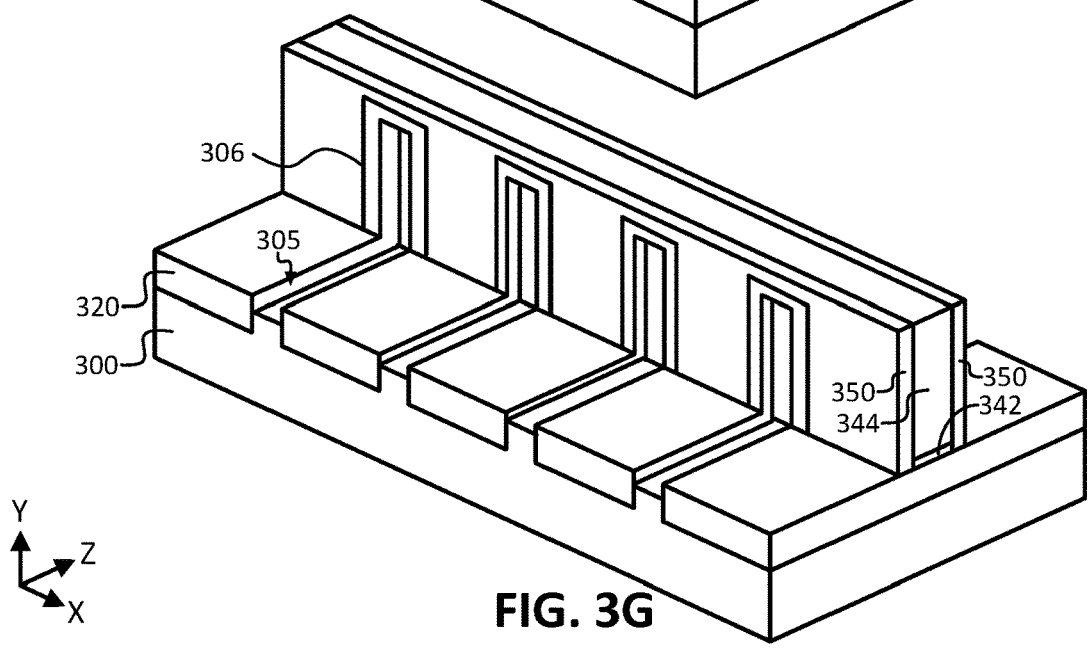

The flow 200' of the method 200 continues by forming 215 a dummy gate stack over a portion of the fins 304 and intervening semiconductor layer 306 to form the example resulting structure of FIG. 3F, in accordance with some embodiments. The flow 200' can be described herein as a gate last transistor fabrication process flow, where the processing includes forming a gate dielectric layer 342, a dummy gate polysilicon layer 344 to be removed later, and adjacent gate spacers 350, before performing the S/D processing, and then forming the final gate stack after the S/D regions have been processed. The flow 200", a "gate first" process, is described below.

Formation of the dummy gate stack may include depositing the dummy gate dielectric material 342 (e.g., silicon dioxide or some other dummy gate dielectric material) and dummy gate electrode material 344 (e.g., polysilicon or some other dummy gate electrode material), patterning the dummy gate stack, depositing gate spacer material 350, and performing a spacer etch to form the structure shown in FIG. 3F, for example. Spacers 350 may include any suitable electrical insulator, dielectric, oxide (e.g., silicon oxide), and/or nitride (e.g., silicon nitride) material, as will be apparent in light of this disclosure. Such spacers 350 can be used to help determine the channel length and/or to help with replacement gate processes, for example. It will be appreciated that while spacer 350 are shown herein as comprising a single (vertically oriented or horizontally oriented) layer, this need not be the case. In some examples, the spacers 350 can include more than one layer whether to tailor the electrical properties (e.g., dielectric constant) of the spacers 350 or to tailor one or more physical dimensions.

It will be noted that the semiconductor layer 306 is disposed between the fins 304 and the gate spacers 350 and between the fins 304 and the dummy gate dielectric 342. The semiconductor layer 306 on the fins 304 and between the fins 304 and the dummy gate dielectric 342 will be removed later, as described below.

Note that in some embodiments, as previously described, the techniques described herein need not include forming a dummy gate stack, such that a final gate stack may be formed in the first instance, as described below in the flow 200". Regardless, the end structure will include the final gate stack described herein, as will be apparent in light of this disclosure. Note that because the IC structures are being described in the context of forming finned transistors, the final gate stack will also be adjacent to either side of the fin, as the gate stack will reside along three walls of the finned channel regions, in embodiments employing a finned (e.g., FinFET) configuration. Also note that in some embodiments, a hardmask may be formed over the dummy gate stack (which may or may not also be formed over spacers 350) to protect the dummy gate stack during subsequent processing, for example. The previous relevant description of hardmask 310 is equally applicable to such a hardmask feature, where employed.

During this process 215, the semiconductor layer 306 may optionally be removed (e.g., etched) from the portions of the fins 304 that are exposed—that is, those portions of the fins 304 that are not covered by the dummy gate stack. This scenario is shown in the embodiment of FIG. 3F. Removal of the semiconductor layer 306 may optionally performed in situation where the portions of the fins 304 shown as exposed in FIG. 3F will be implanted with dopants so as to tailor the electrical properties of these portions to function as source and drain regions. However, removal of the semiconductor layer 306 is not necessary for examples in which the portions of the fins 304 shown in FIG. 3F as exposed will be replaced with a replacement fin material, as described below in FIG. 3G.

Method 200 of FIG. 2 continues with performing the source/drain (S/D) region processing 217. The processing 217 includes, in this example embodiment, removing portions of fins 304 (or replacement fins 330, where employed) located in the S/D regions defined by the dummy gate stack, to form S/D trenches 305 as shown in the example resulting structure of FIG. 3F. In some examples, the semiconductor layer 306 can become recessed by as much as 1 nm or 2 nm during removal of the fins 304, although this does not necessarily happen. As indicated above, an alternative example of S/D region processing 217 includes implanting native fins 304 with dopants to alter their electrical performance.

Figure 3H:
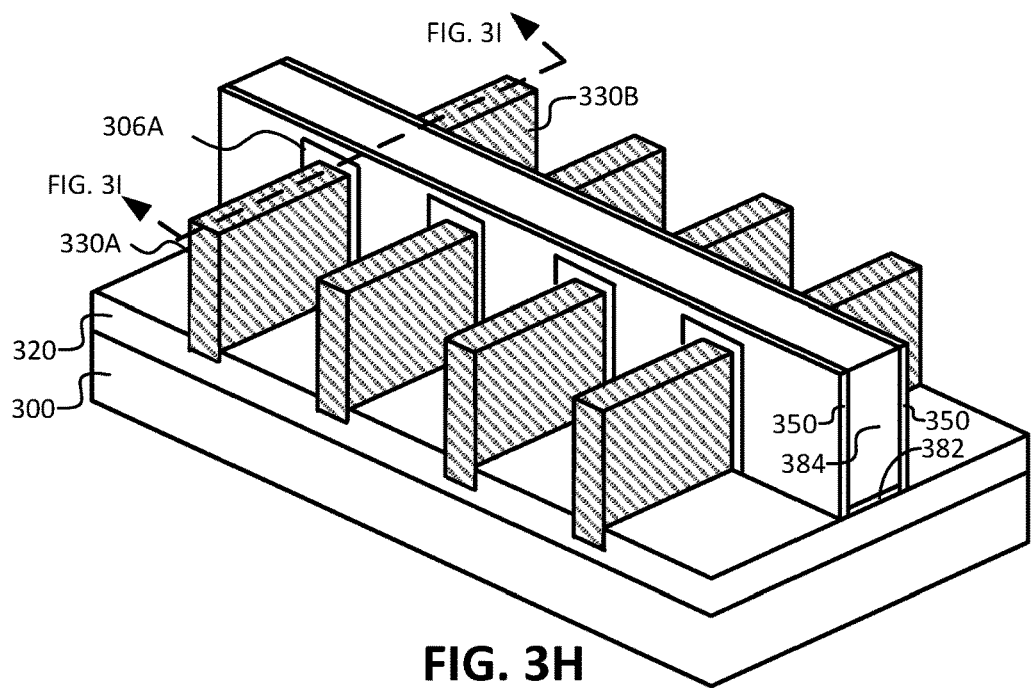

For replacement fin constructions, the processing 217 then includes forming source/drain (S/D) regions 330 of the fins, as shown in FIG. 3H. Note that the S/D regions 330 are referred to herein as such for ease of description, but each S/D region 330 may be either a source region or a drain region, such that the corresponding S/D region (on the other side of the channel region, and thus, on the other side of the dummy gate stack) is the other of the source region and drain region, thereby forming a source and drain region pair. For instance, as shown in FIG. 3H, there are four different S/D region 330 pairs.

In some embodiments, the S/D regions 330 may include any suitable semiconductor material as will be apparent in light of this disclosure, such as monocrystalline group IV semiconductor material. For instance, a given S/D region may include at least one of In, Ga, As, Si, Ge, Sn, among other elements. In some embodiments, as described herein, the material selected for the S/D regions 330 is in coordination with the material used to form the semiconductor layer 306. As described above in various examples, the material selected for the S/D regions 330 is distinct from the semiconductor material selected as the semiconductor layer 306. Other combinations of S/D region materials and substrate materials will be appreciated in light of the present disclosure.

In some embodiments, a given S/D region may or may not include n-type and/or p-type dopant. Where present, the dopant may be included in a concentration in the range of 1E17 to 5E21 atoms per cubic centimeter, for example. In some embodiments, a given S/D region may include grading (e.g., increasing and/or decreasing) of the concentration of one or more materials within the feature, such as the grading of a semiconductor material component concentration and/or the grading of the dopant concentration, for example. For instance, in some such embodiments, the dopant concentration included in a given S/D region may be graded such that it is lower near the corresponding channel region and higher near the corresponding S/D contact (alternatively referred to as an electrode), which may be achieved using any suitable processing, such as tuning the amount of dopant in the reactant flow (e.g., during an in-situ doping scheme), to provide an example. In some embodiments, a given S/D region may include a multilayer structure that includes at least two compositionally different material layers. For instance, in the case of a FFFET device, the source region may include a multilayer structure that includes a p-type doped region and n-type doped region, in accordance with some embodiments. In some embodiments, a given S/D region may be raised such that it extends higher than a corresponding channel region (e.g., in the vertical or Y-axis direction).

Materials that are compositionally different as used herein refers to two materials that have different chemical compositions. This compositional different may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such compositional diversity, the materials may also have distinct dopants (e.g., gallium and magnesium) or the same dopants but at differing concentrations.

Note that the features of the S/D regions 330 are shown with patterning to merely assist with visual identification of the different features in the figures. Also note that the S/D regions 330 are all shown as including the same sizes/shapes in the example structures, for ease of illustration; however, the present disclosure is not intended to be so limited. The patterning and sizing of any of the features in the figures is not intended to limit the present disclosure in any manner. For example, in some embodiments, one of the S/D regions 330 in a corresponding S/D region pair (such as region 330 on one side of the dummy gate stack) may be processed separately than the other S/D region in that pair (such as region 330 on the opposite side of the dummy gate stack), such that a corresponding S/D pair may include different material, dopant type, dopant concentration, sizes, shapes, and/or any other suitable difference as can be understood based on this disclosure. For instance, in the case of a TFET device, one of the S/D regions may include n-type doped semiconductor material and the other of the S/D regions may include p-type doped semiconductor material, to provide an example case, such that the n-type S/D region may be processed separately from the p-type S/D region. The separate processing may be achieved using any suitable techniques, such as masking off S/D regions not to be processed to allow processing of other S/D regions, and then masking off the other S/D regions to allow processing of the originally masked off S/D regions, for example. In some embodiments, a given S/D region may include the same or a similar material composition (e.g., within 1% different) as the corresponding/adjacent channel region (such as both including the same Ge-rich material). However, in other embodiments, a given S/D region may include a different material composition (e.g., at least 1, 2, 3, 4, 5, or 10% different) relative to the corresponding/adjacent channel region, for example.

Figure 3I:
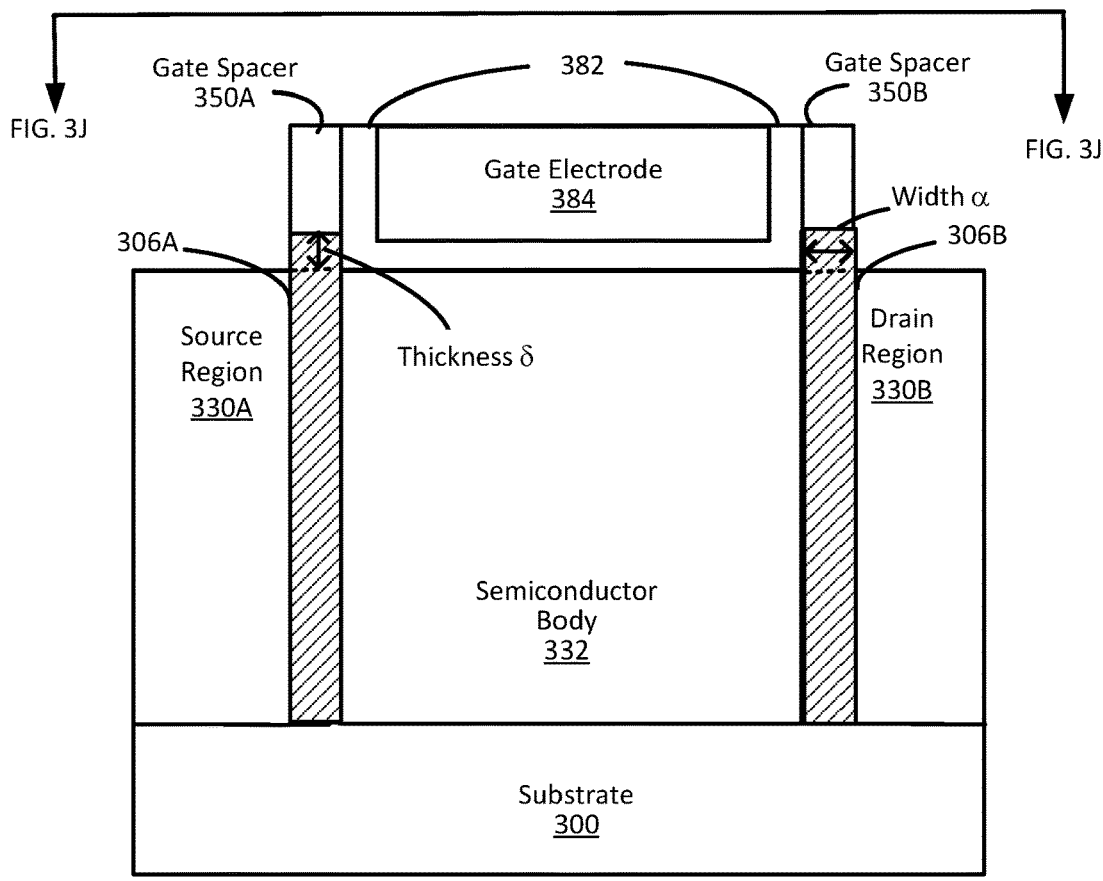
Figure 3I:
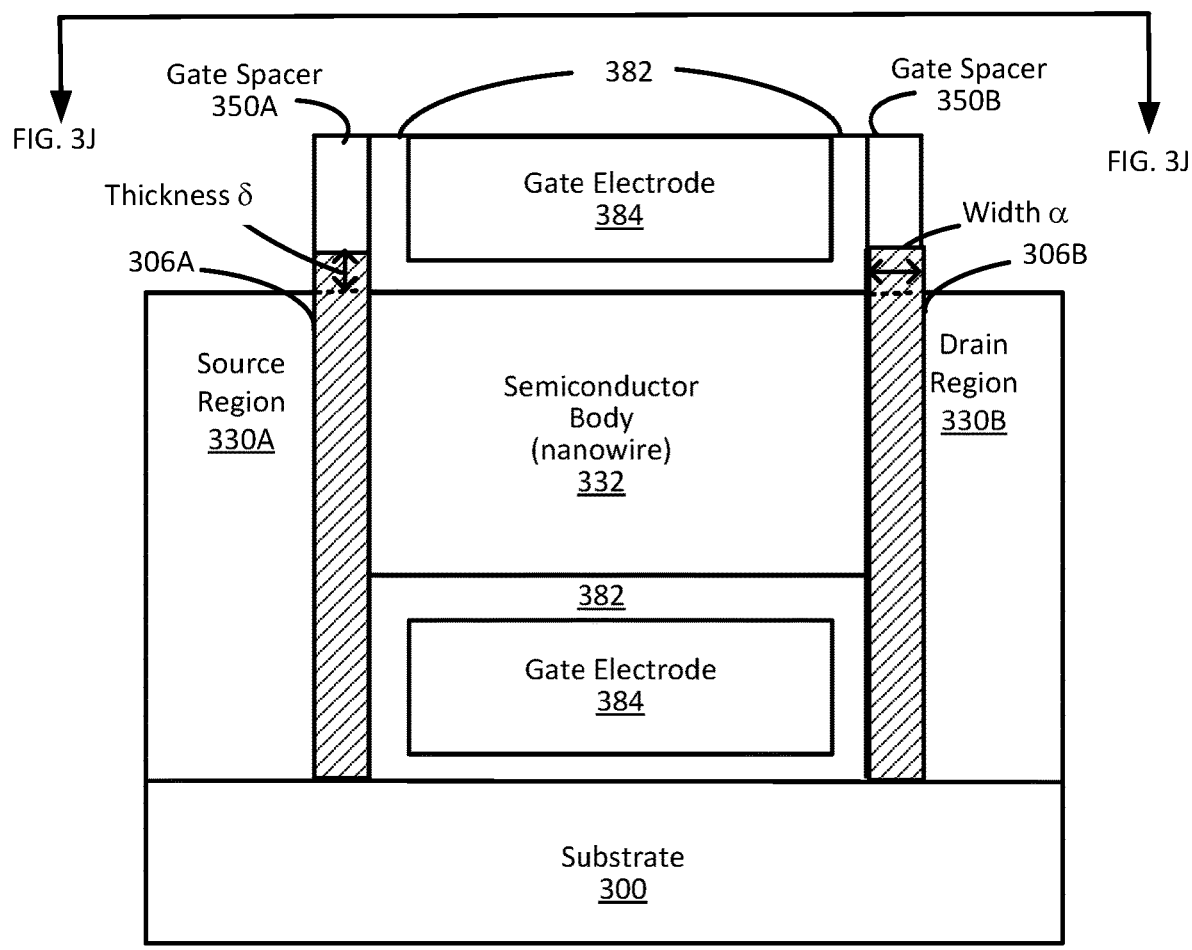

The flow 200' of the method 200 continues with performing 219 the final gate stack processing to form the example resulting structure also shown in FIG. 3H, in accordance with some embodiments. The final gate stack processing 219, in this example embodiment, includes removing the dummy gate stack (including dummy gate 344 and dummy gate dielectric 342) to expose the underlying channel region and to allow for the final gate stack to be formed. Note the channel region can be formed into one or more nanowires or otherwise ribbonized or shaped, prior to forming the final gate stack, as shown in FIG. 3I'. Furthermore, in this flow 200' of the method 200, the portion of the semiconductor layer 306 disposed under the dummy gate 344 and dummy gate dielectric 342 is also removed 221, thus leaving the remaining portions of the semiconductor layer 306 between the replacement fin 330 and the spacers 350 on opposing sides of the semiconductor body 332. This removal 221 of the semiconductor layer 306 allows for contact between the gate stack and the underlying portion of the fin or nanowire(s) (generally, semiconductor body 332) corresponding to the channel region, as shown in FIGS. 3I and 3I'. The final gate stack can include gate dielectric 382 and gate electrode 384 on the semiconductor body 332 as shown in FIGS. 3H and 3I/3I'. Note that the gate dielectric 382 and at least a portion of gate electrode 384 will wrap around the semiconductor body 332 in nanowire configurations.

Any number of gate stack configurations can be used. The gate spacers 350 may be, for example, silicon nitride or silicon dioxide. The gate dielectric 382 may be, for example, any suitable gate dielectric material such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric 382 to improve its quality when a high-k material is used. Further, the gate electrode 384 may comprise a wide range of suitable metals or metal alloys, such as aluminum, tungsten, titanium, tantalum, copper, titanium nitride, or tantalum nitride, for example. In some embodiments, the gate dielectric 382 and/or gate electrode 384 may include a multilayer structure of two or more material layers or components. For instance, in one such embodiment, the gate dielectric 382 is a bi-layer structure having a first dielectric material (e.g., silicon dioxide) in contact with the channel region and a second dielectric material (e.g., hafnium oxide) in contact with the first dielectric material, the first dielectric material having a dielectric constant that is lower than the dielectric constant of the second dielectric material. Likewise, the gate electrode 384 structure may include a central metal plug portion (e.g., tungsten) with one or more outer work function layers and/or barrier layers (e.g., tantalum, tantalum nitride), and/or a resistance reducing cap layer (e.g., copper, gold). In some embodiments, the gate dielectric 382 and/or gate electrode 384 may include grading (increasing or decreasing, as the case may be) of the concentration of one or more materials therein. Numerous different gate structure configurations can be used, as will be apparent in light of this disclosure.

As noted above, when the dummy gate and the semiconductor layer 306 are removed 221, the semiconductor body 332 (which includes the channel region of fins 304 or replacement material fins 330) previously covered by the dummy gate stack, is exposed to allow for any desired processing of the channel region disposed therein. Such processing of a given channel region may include various different techniques, such as removing and replacing the semiconductor body 332 with replacement material, doping the semiconductor body 332 as desired, forming the semiconductor body 332 into one or more nanowires (or nanoribbons) for a gate-all-around (GAA) transistor configuration, forming the channel region into a beaded-fin configuration, cleaning/polishing the channel region, and/or any other suitable processing as will be apparent in light of this disclosure.

Figure 3J:
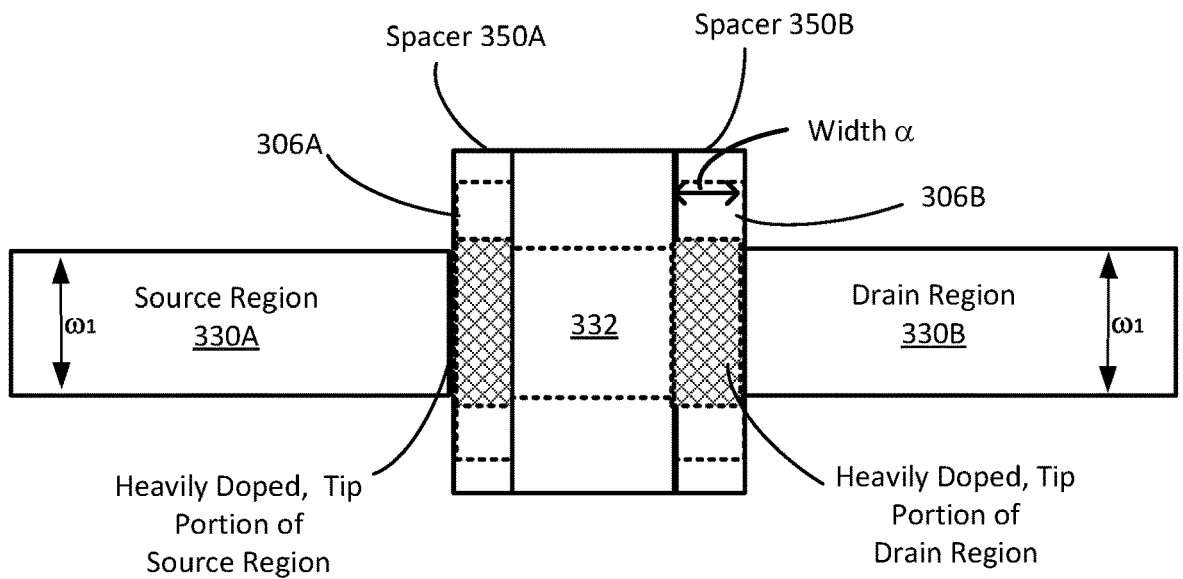

FIGS. 3I and 3I' each illustrates a cross-sectional view of a semiconductor device taken in the direction indicated in FIG. 3H. FIG. 3J is a plan view of the semiconductor device from the perspective indicated in FIGS. 3I and 3I'. Concurrent reference to FIGS. 3I/3I' and 3J will facilitate explanation. As shown in these figures, semiconductor layer 306A (patterned with diagonal lines in FIG. 3I/3I') conforms to a top portion of the source region 330A disposed between the source region 330A and a corresponding gate spacer 350A. The semiconductor layer 306A also conforms to sidewalls of the source region 330A, extending from the top portion of the source region 330A to a bottom interface with the STI layer 320. Note the sidewalls of source region 330A and drain region 330B are relatively straight and vertical in the example embodiment depicted, but in other embodiments may be faceted or curvilinear or any other shape that may result as a function of the source/drain processing. For instance, in some embodiments an undercut etch is used and the orientation of the underlying semiconductor body 332 with respect to the etch scheme is such that the source/drain recesses formed prior to source/drain epitaxial deposition extend under the respective gate spacers 350 and possibly the gate electrode 382 to provide so-called epi-tip regions. In any such cases, semiconductor layer 306A may conform to sidewalls of the source region 330A and semiconductor layer 306B may conform to sidewalls of the drain region 330B. Numerous variations will be apparent in light of this disclosure. The semiconductor layer 306A may have a thickness $\delta$ and a width $\alpha$, as indicated in FIG. 3I/3I', each of which may independently be within any of the ranges indicated above.

As shown in FIG. 3J, the portion of the source region 330A and the drain region 330B disposed under a corresponding semiconductor layer 306A, 306B has a width $\omega 1$ that is approximately the same as that of the other portions of the source region 330A and drain region 330B. In the example shown, the width in this region is greater than the width ω1, as a result of the protection provided that portion of the source and drain regions 330A, 330B by the semiconductor layer 306 during various etches and thermal processing that could otherwise cause some of the source/drain regions 330A, 330B to be chemically removed or oxidized, as illustrated in FIG. 1B.

Figure 3K:
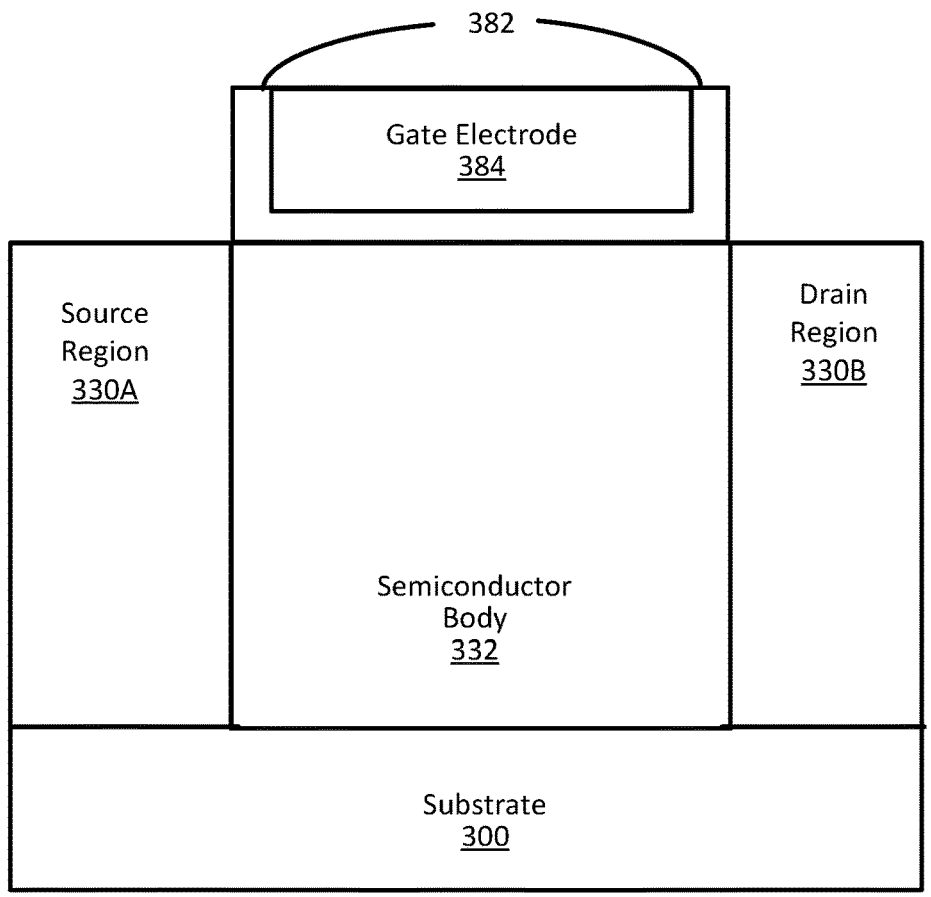
Figure 3L:
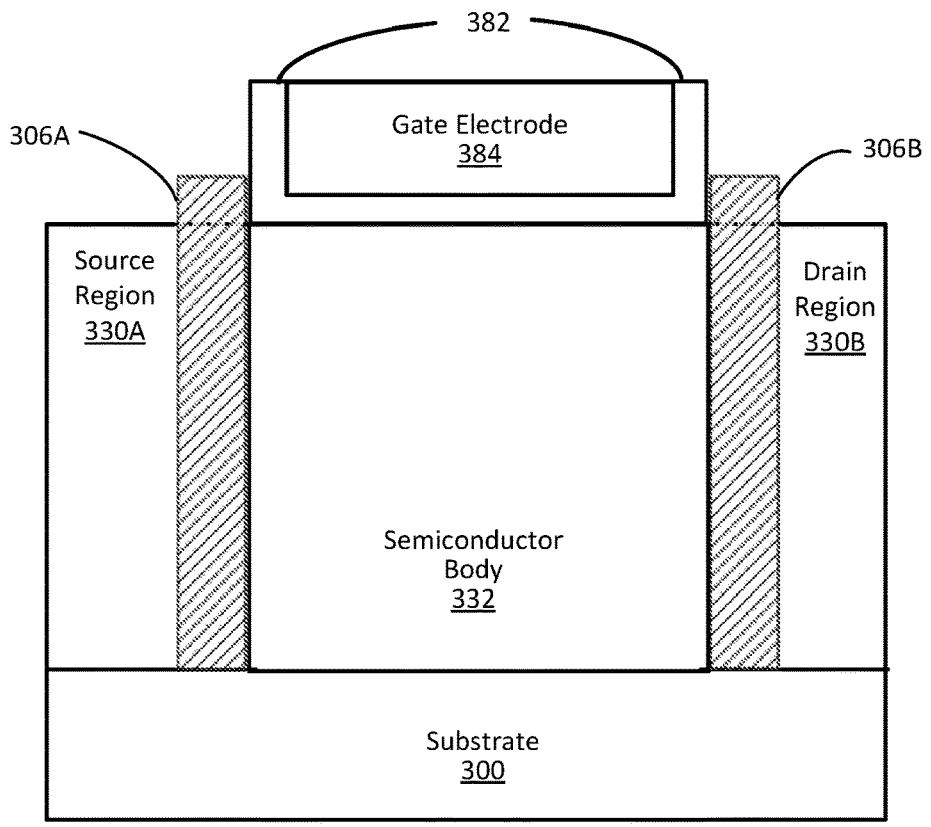
Figure 3M:
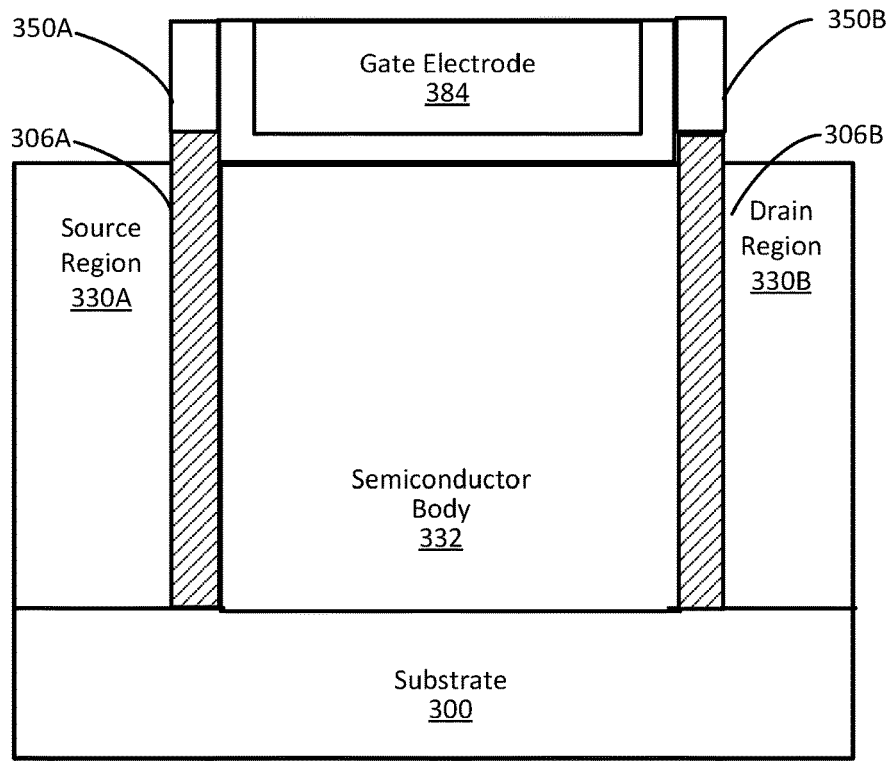
Figure 3K:
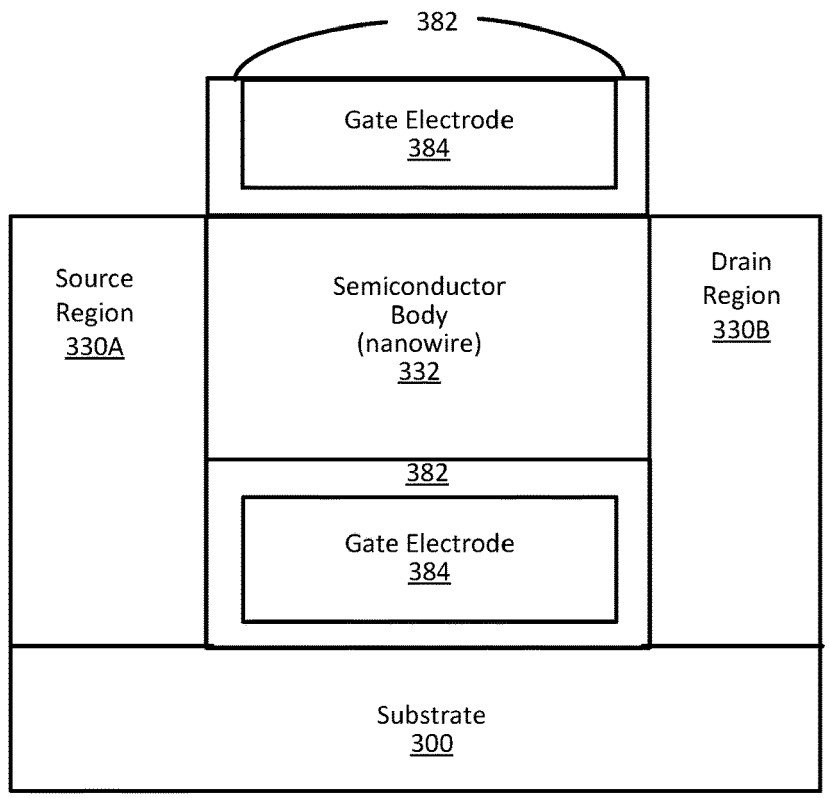
Figure 3L:
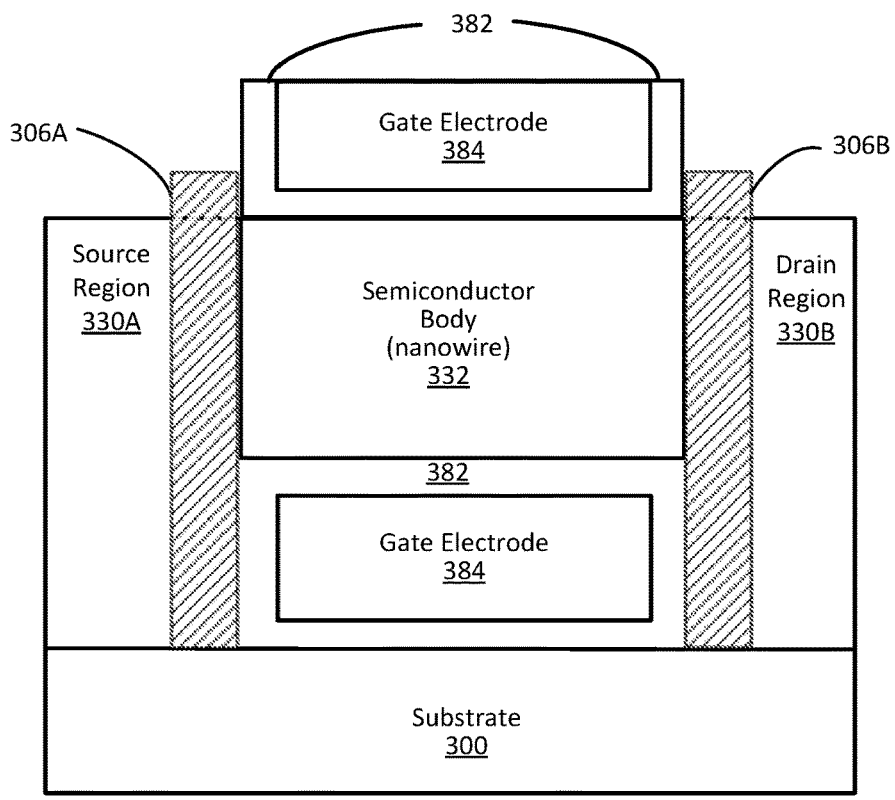
Figure 3M:
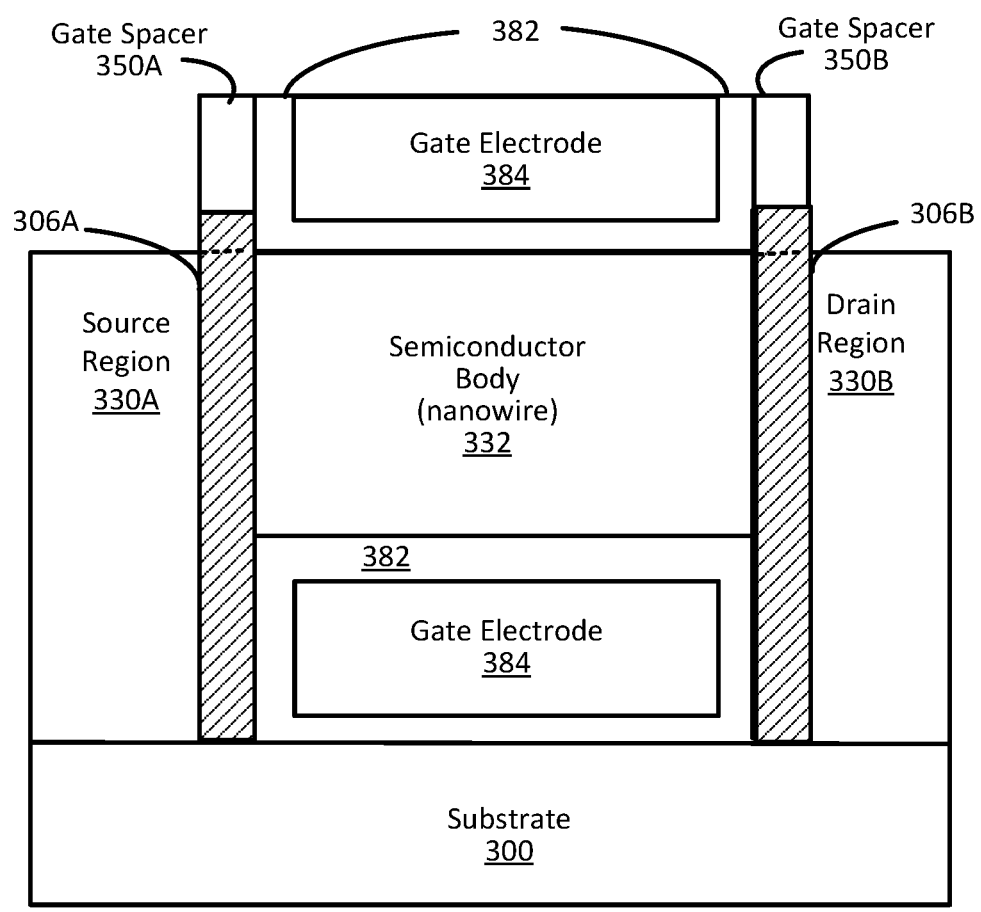
Figure 3N:
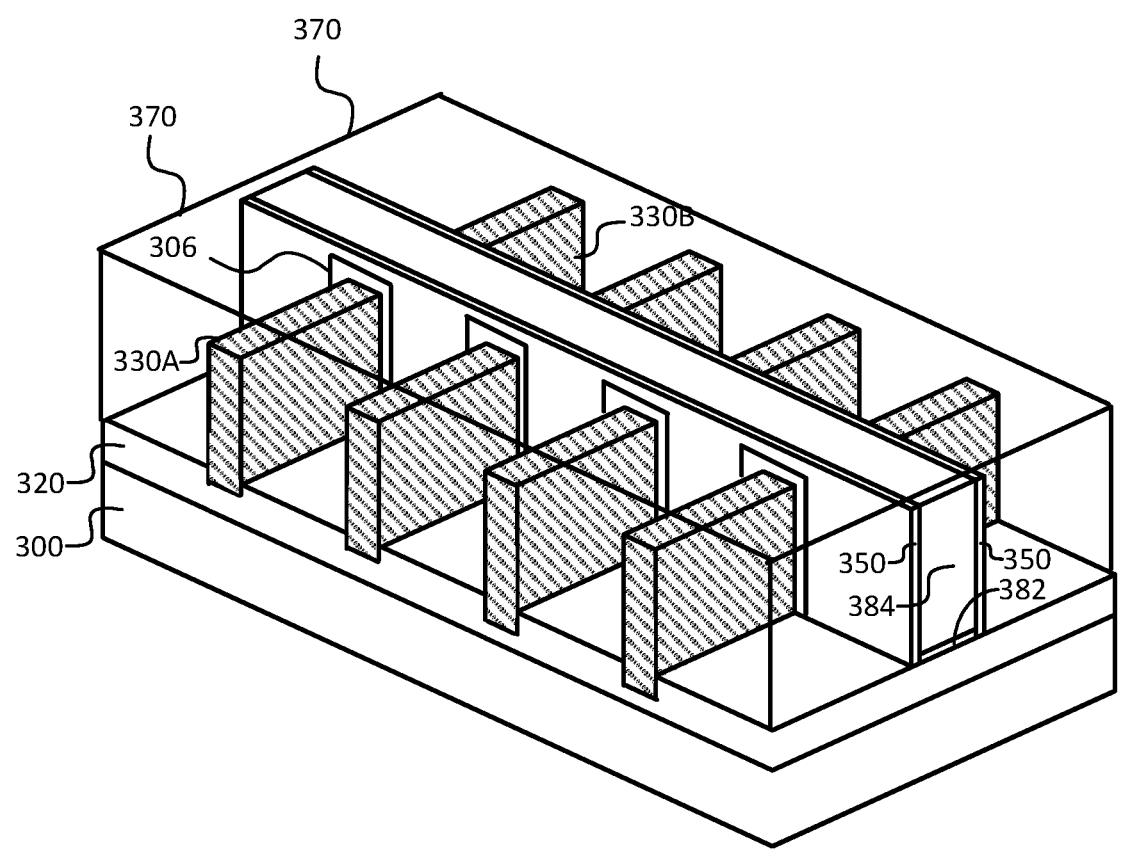

Turning now to the flow 200" of the method 200, the gate dielectric layer 382 and gate electrode 384 are formed 214 on the fins 304 using any of the previously described techniques and materials. This is shown in FIG. 3K, which is a cross-sectional view taken perpendicular to the gate. The semiconductor layer 306 is then formed 216 on the exposed portions of the source region 330A and the drain region 330B, as shown in FIG. 3L. While the semiconductor layer 306 is shown as conformally disposed on only a portion of the source region 330A and the drain region 330B for convenience of depiction, it will be appreciated that the semiconductor layer 306 can be conformally disposed over some or all of the exposed portions of the source region 330A and the drain region 330B and selectively removed in subsequent processing, as will be appreciated in light of the present disclosure. Gate spacers 350A and 350B are then formed 218 using any of the materials and processes previously described, as shown in FIG. 3M. The plan view of the structure depicted in FIG. 3M corresponds to that already illustrated in FIG. 3J, including the conformal layering of semiconductor layer 306A, 306B between the source/drain regions 330A, 330B and corresponding spacers 350A, 350B. S/D region processing is performed 220, as described above in the context of the flow 200'.

As will be appreciated, the channel region of the example embodiment depicted in FIGS. 3K-M is part of a fin structure, and the gate structure is formed on the top and opposing sides of the fin. In other embodiments, such as shown in FIGS. 3K'-M', the channel region of the fin structure is formed into one or more nanowires or ribbons, as previously explained. As can be seen, in such cases, the gate structure (including gate dielectric layer 382 and at least part of gate electrode 384) can be formed around the nanowires/ribbons. As previously explained, the fin structure can be formed with an eye on subsequently forming nanowires, using trench-based fin replacement techniques. Example trench-based replacement fin forming techniques are provided, for instance, in U.S. Pat. No. 9,728,464. In some such cases, the replacement fin material is provided as alternating layers of desired channel material and sacrificial/inactive material such as described in U.S. Pat. No. 9,812,524. Such multilayer fins are particularly useful for forming nanowire transistors (e.g., where the sacrificial/inactive material is removed during final gate processing, prior to deposition of final gate materials, so as to liberate or ribbonize the channel material). Any number of fin forming processes can be used in the context of the present disclosure, as will be appreciated.

FIG. 3N illustrates an example embodiment in which interlayer dielectric (ILD) layer 370 is deposited on the structure of FIG. 3I or 3M (or 3I' or 3M', as the case may be), followed by planarization and/or polishing (e.g., CMP) to reveal the gate stack. Note that ILD layer 370 is shown as transparent in the example structure of FIG. 3N to allow for the underlying features to be seen; however, the present disclosure is not intended to be so limited. Also note that ILD layer 370 may include a multilayer structure, even though it is illustrated as a single layer. Further note that in some cases, ILD layer 370 and STI material 320 may not include a distinct interface as shown in FIG. 3N, particularly where, e.g., the ILD layer 370 and STI material 320 include the same dielectric material (e.g., where both include silicon dioxide). In some embodiments, the ILD layer 370 may include any desired electrical insulator, dielectric, oxide (e.g., silicon oxide), and/or nitride (e.g., silicon nitride) material, as will be apparent in light of this disclosure. Method 200 of FIG. 2 (for both flows 200' and 200") continues with performing 222 S/D electrode processing. S/D electrode processing 222, in this example embodiment, first includes forming S/D electrode trenches above the S/D regions 330 through the ILD layer 370 shown in FIG. 3N. In some such embodiments, the contact trenches may be formed using any suitable techniques, such as performing one or more wet and/or dry etch processes to remove portions of ILD layer 370 as shown, and/or any other suitable processing as will be apparent in light of this disclosure. Such etch processing may be referred to as the S/D electrode trench etch processing, or simply, electrode (or equivalently "contact") trench etch processing. Further, in some such embodiments, the ILD may first be patterned such that areas that are not to be removed via the contact trench etch processing are masked off, for example. In some embodiments, one or more etch stop layers may have been formed on S/D regions 330 prior to performing the contact trench etch processing, to help with the controllability of the processing (e.g., to help stop the etching to help prevent the etching from consuming material of the S/D regions 330 in an undesired manner). In some such embodiments, the etch stop layer(s) may include insulator material that is dissimilar from the ILD 370 material (e.g., to provide relative etch selectivity) and/or material that that is resilient to the contact trench etch, such as a carbon-based etch stop layer (e.g., with carbon concentration in the range of 1-80%).

S/D electrodes processing 222 includes forming S/D electrodes above respective S/D regions in accordance with some embodiments. It will be appreciated that S/D contacts are electrically connected to S/D regions 330, and in some cases, they may also be in physical contact with those S/D regions 330. In some embodiments, S/D electrodes may be formed using any suitable techniques, such as depositing metal or metal alloy (or other suitable electrically conductive material) in the contact trenches. In some embodiments, S/D electrodes formation may include silicidation, germanidation, and/or annealing processes, for example, where such processing may be performed to form an intervening electrodes layer before forming the bulk electrode metal structure, for instance. In some embodiments, S/D electrodes may include aluminum or tungsten, although any suitable conductive metal or alloy can be used, such as silver, nickel-platinum, or nickel-aluminum, for example. Generally, in some embodiments, one or more of the S/D electrodes may include a resistance reducing metal and an electrode plug metal, or just an electrode plug, for instance. Example electrode resistance reducing metals include, for instance, nickel, aluminum, titanium, gold, gold-germanium, nickel-platinum, or nickel aluminum, and/or other such resistance reducing metals or alloys. Example electrode plug metals include, for instance, aluminum, copper, nickel, platinum, titanium, or tungsten, or alloys thereof, although any suitably conductive contact metal or alloy may be used. In some embodiments, S/D electrodes may employ low work-function metal material(s) and/or high work-function metal material(s), depending on the particular configuration. In some embodiments, additional layers may be present in the S/D electrode regions, such as adhesion layers (e.g., titanium nitride) and/or liner or barrier layers (e.g., tantalum nitride), if so desired.

Method 200 of FIG. 2 continues with completing 224 integrated circuit (IC) processing as desired, in accordance with some embodiments. Such additional processing to complete the IC may include back-end or back-end-of-line (BEOL) processing to form one or more metallization layers and/or to interconnect the transistor devices formed during front-end or front-end-of-line (FEOL) processing, for example. Any other suitable processing may be performed, as will be apparent in light of this disclosure. Note that the processes 202-224 of method 200 are shown in a particular order for ease of description. However, one or more of the processes 202-224 may be performed in a different order or may not be performed at all. Recall that the techniques may be used to form a multitude of different transistor types and configurations. Although the techniques are primarily depicted and described herein in the context of employing one or more dopant diffusion barrier elements for both of the S/D regions of a given transistor, the present disclosure is not intended to be so limited, as the techniques may be used to benefit only one S/D region of a given transistor (and thus, only one side of a given channel region), and not the other, in some embodiments. Numerous variations and configurations will be apparent in light of the present disclosure.

Example System

Figure 4:
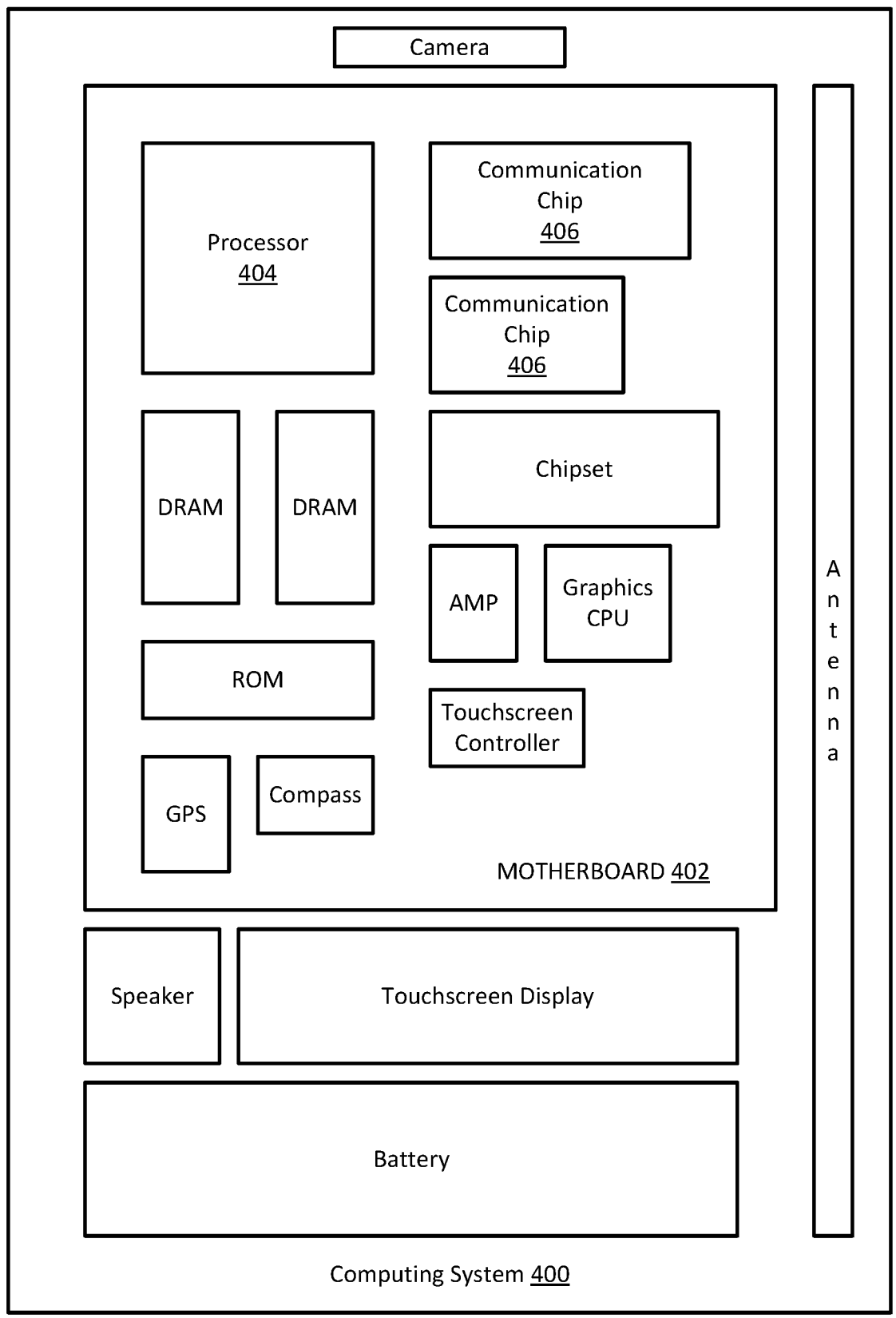
FIG. 4 illustrates a computing system implemented with integrated circuit structures and/or transistor devices formed using the techniques disclosed herein, in accordance with some embodiments of the present disclosure.

FIG. 4 is an example computing system implemented with one or more of the integrated circuit structures as disclosed herein, in accordance with some embodiments of the present disclosure. As can be seen, the computing system 400 houses a motherboard 402. The motherboard 402 may include a number of components, including, but not limited to, a processor 404 and at least one communication chip 406, each of which can be physically and electrically coupled to the motherboard 402, or otherwise integrated therein. As will be appreciated, the motherboard 402 may be, for example, any printed circuit board, whether a main board, a daughterboard mounted on a main board, or the only board of system 400, etc.

Depending on its applications, computing system 400 may include one or more other components that may or may not be physically and electrically coupled to the motherboard 402. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 400 may include one or more integrated circuit structures or devices configured in accordance with an example embodiment. In some embodiments, multiple functions can be integrated into one or more chips (e.g., for instance, note that the communication chip 406 can be part of or otherwise integrated into the processor 404).

The communication chip 406 enables wireless communications for the transfer of data to and from the computing system 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others. In some embodiments, communication chip 406 may include one or more transistor structures having a transistor device configured as variously described above.

The processor 404 of the computing system 400 includes an integrated circuit die packaged within the processor 404. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 406 also may include an integrated circuit die packaged within the communication chip 406. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 404 (e.g., where functionality of any chips 406 is integrated into processor 404, rather than having separate communication chips). Further note that processor 404 may be a chip set having such wireless capability. In short, any number of processor 404 and/or communication chips 406 can be used. Likewise, any one chip or chip set can have multiple functions integrated therein.

In various implementations, the computing system 400 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

FURTHER EXAMPLE EMBODIMENTS

The following examples pertain to further embodiments, from which numerous permutations and configurations will be apparent.

Example 1 is an integrated circuit device comprising: a semiconductor body comprising a first semiconductor material; a source region on a first side of the semiconductor body, the source region comprising a second semiconductor material compositionally different from the first semiconductor material; a drain region on a second side of the semiconductor body opposite the first side, the source region comprising the second semiconductor material; a gate structure including a first gate spacer at least partially over the source region and a second gate spacer at least partially over the drain region; a first semiconductor layer between the source region and the first gate spacer comprising a third semiconductor material compositionally different from the first semiconductor material and the second semiconductor material; and a second semiconductor layer between the drain region and the second gate spacer comprising the third semiconductor material.

Example 2 includes the subject matter of Example 1, wherein the semiconductor body comprises silicon and germanium; the first semiconductor layer comprises silicon; and the second semiconductor layer comprises silicon.

Example 3 includes the subject matter of Example 1, wherein the semiconductor body comprises indium, gallium, and arsenic; the first semiconductor layer comprises indium and phosphorous; and the second semiconductor layer comprises indium and phosphorous.

Example 4 includes the subject matter of Example 1, wherein the semiconductor body comprises indium, gallium, and arsenic; the first semiconductor layer comprises indium, gallium, aluminum, and nitrogen; and the second semiconductor layer comprises indium, gallium, aluminum, and nitrogen.

Example 5 includes the subject matter of Example 1, wherein the semiconductor body comprises gallium and arsenic; the first semiconductor layer comprises indium and phosphorous; and the second semiconductor layer comprises indium and phosphorous.

Example 6 includes the subject matter of Example 1, wherein the semiconductor body comprises gallium and arsenic; the first semiconductor layer comprises indium, gallium, aluminum, and nitrogen; and the second semiconductor layer comprises indium, gallium, aluminum, and nitrogen.

Example 7 includes the subject matter of any of the preceding Examples, wherein the source region and the drain region comprise a dopant material; and the first gate spacer and the second gate spacer are depleted of the dopant material because the first semiconductor layer isolates the source region from the first gate spacer, and the second semiconductor layer isolates the drain region from the second gate spacer.

Example 8 includes the subject matter of any of the preceding Examples, wherein the first semiconductor layer is a single crystal, and wherein crystallographic planes of the single crystal first semiconductor layer have a one to one epitaxial correspondence with corresponding planes of a single crystal source region.

Example 9 includes the subject matter of any of the preceding Examples, wherein the second semiconductor layer is a single crystal, and wherein crystallographic planes of the single crystal second semiconductor layer have a one to one epitaxial correspondence with corresponding planes of a single crystal drain region.

Example 10 includes the subject matter of any of the preceding Examples, wherein the first semiconductor layer and the second semiconductor layer are conformal to a top surface and at least portions of opposing side surfaces of the source region and the drain region, respectively.

Example 11 includes the subject matter of Example 10, wherein the conformal first and second semiconductor layers separate the source region and the drain region from the first gate spacer and the second gate spacer, respectively.

Example 12 includes the subject matter of any of the preceding Examples, wherein the first semiconductor layer and the second semiconductor layer are from 0.2 nm to 4 nm thick.

Example 13 includes the subject matter of any of the preceding Examples, wherein the first semiconductor layer and the second semiconductor layer are from 1 nm to 3 nm thick.

Example 14 includes the subject matter of any of the preceding Examples, wherein the first semiconductor layer and the second semiconductor layer have a width within 1 nm of the first gate spacer and the second gate spacer, respectively.

Example 15 includes the subject matter of any of the preceding Examples, wherein the semiconductor body is a fin structure and the gate structure is on a top and opposing sides of the fin so as to provide a finFET structure.

Example 16 includes the subject matter of any of Examples 1-15, wherein the semiconductor body includes one or more nanowires and the gate structure is around the one or more nanowires so as to provide a gate-all-around structure.

Example 17 is a method for fabricating a semiconductor device, the method comprising: forming a semiconductor body comprising a first semiconductor material; forming a gate structure on a top surface and opposing sidewalls of the semiconductor body, thereby defining a non-planar channel region in the semiconductor body, the gate structure including a gate dielectric structure on the top and the opposing sidewalls of the semiconductor body, a gate electrode structure on the gate dielectric structure, and first and second gate spacers on opposing sides of the gate dielectric structure; forming a source region and a drain region adjacent to the semiconductor body, the source region and the drain region on opposite sides of the semiconductor body and comprising a second semiconductor material compositionally different from the first semiconductor material; and forming a first semiconductor layer on the source region between the source region and the first gate spacer and a second semiconductor layer on the drain region between the drain region and the second gate spacer, the first and second semiconductor layers comprising a third semiconductor material compositionally different from the first semiconductor material and the second semiconductor material.

Example 18 includes the subject matter of Example 17, wherein the first semiconductor layer and the second semiconductor layer are epitaxially formed with the source region and the drain region, respectively.

Example 19 includes the subject matter of either of Example 17 or Example 18, wherein the first semiconductor layer and the second semiconductor layer are conformally disposed over the source region and the drain region from a top surface of a corresponding one of the source region and the drain region to a bottom interface with a shallow trench isolation layer.

Example 20 includes the subject matter of any of Examples 17-19, wherein the first semiconductor layer and the second semiconductor layer are from 0.2 nm to 4 nm thick.

Example 21 includes the subject matter of any of Examples 17-20, wherein the source region and the drain region comprise a dopant material, and wherein the first semiconductor layer and the second semiconductor layer reduce diffusion of the dopant material from the source region and the drain region into the first gate spacer and the second gate spacer, respectively.

Example 22 includes the subject matter of any of Examples 17-21, wherein the semiconductor body comprises silicon and germanium; the first semiconductor layer comprises silicon; and the second semiconductor layer comprises silicon.

What is claimed is:

1. An integrated circuit device comprising:
   a semiconductor body comprising a first semiconductor material;
   a source region on a first side of the semiconductor body, the source region comprising a second semiconductor material compositionally different from the first semiconductor material;
   a drain region on a second side of the semiconductor body opposite the first side, the source region comprising the second semiconductor material;
   a gate structure including a first gate spacer at least partially over the source region and a second gate spacer at least partially over the drain region;
   a first semiconductor layer between the source region and the first gate spacer comprising a third semiconductor material compositionally different from the first semiconductor material and the second semiconductor material; and
   a second semiconductor layer between the drain region and the second gate spacer comprising the third semiconductor material.

2. The integrated circuit device of claim 1, wherein:
   the semiconductor body comprises silicon and germanium;
   the first semiconductor layer comprises silicon; and
   the second semiconductor layer comprises silicon.

3. The integrated circuit device of claim 1, wherein:
   the semiconductor body comprises indium, gallium, and arsenic;
   the first semiconductor layer comprises indium and phosphorous; and
   the second semiconductor layer comprises indium and phosphorous.

4. The integrated circuit device of claim 1, wherein:
   the semiconductor body comprises indium, gallium, and arsenic;
   the first semiconductor layer comprises indium, gallium, aluminum, and nitrogen; and
   the second semiconductor layer comprises indium, gallium, aluminum, and nitrogen.

5. The integrated circuit device of claim 1, wherein:
   the semiconductor body comprises gallium and arsenic;
   the first semiconductor layer comprises indium and phosphorous; and
   the second semiconductor layer comprises indium and phosphorous.

6. The integrated circuit device of claim 1, wherein:
   the semiconductor body comprises gallium and arsenic;
   the first semiconductor layer comprises indium, gallium, aluminum, and nitrogen; and
   the second semiconductor layer comprises indium, gallium, aluminum, and nitrogen.

7. The integrated circuit device of claim 1, wherein:
   the source region and the drain region comprise a dopant material; and
   the first gate spacer and the second gate spacer are depleted of the dopant material because the first semiconductor layer isolates the source region from the first gate spacer, and the second semiconductor layer isolates the drain region from the second gate spacer.

8. The integrated circuit device of claim 1, wherein the first semiconductor layer is a single crystal, and wherein crystallographic planes of the single crystal first semiconductor layer have a one to one epitaxial correspondence with corresponding planes of a single crystal source region.

9. The integrated circuit device of claim 1, wherein the second semiconductor layer is a single crystal, and wherein crystallographic planes of the single crystal second semiconductor layer have a one to one epitaxial correspondence with corresponding planes of a single crystal drain region.

10. The integrated circuit device of claim 1, wherein the first semiconductor layer and the second semiconductor layer are conformal to a top surface and at least portions of opposing side surfaces of the source region and the drain region, respectively.

11. The integrated circuit device of claim 10, wherein the conformal first and second semiconductor layers separate the source region and the drain region from the first gate spacer and the second gate spacer, respectively.

12. The integrated circuit device of claim 1, wherein the first semiconductor layer and the second semiconductor layer are from 0.2 nm to 4 nm thick.

13. The integrated circuit device of claim 1, wherein the first semiconductor layer and the second semiconductor layer are from 1 nm to 3 nm thick.

14. The integrated circuit device of claim 1, wherein the first semiconductor layer and the second semiconductor layer have a width within 1 nm of the first gate spacer and the second gate spacer, respectively.

15. The integrated circuit device of claim 1, wherein the semiconductor body is a fin structure and the gate structure is on a top and opposing sides of the fin so as to provide a finFET structure.

16. The integrated circuit device of claim 1, wherein the semiconductor body includes one or more nanowires and the gate structure is around the one or more nanowires so as to provide a gate-all-around structure.

17. A method for fabricating a semiconductor device, the method comprising:
    forming a semiconductor body comprising a first semiconductor material;
    forming a gate structure on a top surface and opposing sidewalls of the semiconductor body, thereby defining a non-planar channel region in the semiconductor body, the gate structure including a gate dielectric structure on the top and the opposing sidewalls of the semiconductor body, a gate electrode structure on the gate dielectric structure, and first and second gate spacers on opposing sides of the gate dielectric structure;
    forming a source region and a drain region adjacent to the semiconductor body, the source region and the drain region on opposite sides of the semiconductor body and comprising a second semiconductor material compositionally different from the first semiconductor material; and
    forming a first semiconductor layer on the source region between the source region and the first gate spacer and a second semiconductor layer on the drain region between the drain region and the second gate spacer, the first and second semiconductor layers comprising a third semiconductor material compositionally different from the first semiconductor material and the second semiconductor material.

18. The method of claim 17, wherein the first semiconductor layer and the second semiconductor layer are epitaxially formed with the source region and the drain region, respectively.

19. The method of claim 17, wherein the first semiconductor layer and the second semiconductor layer are conformally disposed over the source region and the drain region from a top surface of a corresponding one of the source region and the drain region to a bottom interface with a shallow trench isolation layer.

20. The method of claim 17, wherein the first semiconductor layer and the second semiconductor layer are from 0.2 nm to 4 nm thick.

\* \* \* \* \*